United States Patent [19]

Brueck et al.

[11] Patent Number: 5,759,744
[45] Date of Patent: Jun. 2, 1998

[54] METHODS AND APPARATUS FOR LITHOGRAPHY OF SPARSE ARRAYS OF SUB-MICROMETER FEATURES

[75] Inventors: Steven R.J. Brueck; Xiaolan Chen; Saleem Zaidi, all of Albuquerque, N. Mex.; Daniel J. Devine, Los Gatos, Calif.

[73] Assignee: University of New Mexico, Albuquerque, N. Mex.

[21] Appl. No.: 407,067

[22] Filed: Mar. 16, 1995

Related U.S. Application Data

[63] Continuation-in-part of Ser. No. 399,381, Feb. 24, 1995, abandoned.
[51] Int. Cl.$^6$ .................................................. G03F 7/22
[52] U.S. Cl. .......................... 430/312; 430/313; 430/394
[58] Field of Search .................................. 430/1, 2, 311, 430/312, 313, 323, 394

[56] References Cited

U.S. PATENT DOCUMENTS

| | | | |
|---|---|---|---|
| 4,402,571 | 9/1983 | Cowan | 350/162.17 |
| 4,496,216 | 1/1985 | Cowan . | |
| 5,415,835 | 5/1995 | Brueck | 430/311 |

OTHER PUBLICATIONS

SPIE 2197: Optical/Laser Microlithography VII, T.A. Brunner, editor, pp. 869–875 (1994).
J. Vac. Sci. Technol. B 11 (3), May/Jun. 1993.
AIChE Journal, Dec. 1991, vol. 37, No. 12, pp. 1863–1874.

*Primary Examiner*—Kathleen Duda
*Attorney, Agent, or Firm*—Snell & Wilmer L.L.P.

[57] ABSTRACT

Methods and apparatuses are disclosed for the exposure of sparse hole and/or mesa arrays with line:space ratios of 1:3 or greater and sub-micrometer hole and/or mesa diameters in a layer of photosensitive material atop a layered material. Methods disclosed include: double exposure interferometric lithography pairs in which only those areas near the overlapping maxima of each single-period exposure pair receive a clearing exposure dose; double interferometric lithography exposure pairs with additional processing steps to transfer the array from a first single-period interferometric lithography exposure pair into an intermediate mask layer and a second single-period interferometric lithography exposure to further select a subset of the first array of holes; a double exposure of a single period interferometric lithography exposure pair to define a dense array of sub-micrometer holes and an optical lithography exposure in which only those holes near maxima of both exposures receive a clearing exposure dose; combination of a single-period interferometric exposure pair, processing to transfer resulting dense array of sub-micrometer holes into an intermediate etch mask, and an optical lithography exposure to select a subset of initial array to form a sparse array; combination of an optical exposure, transfer of exposure pattern into an intermediate mask layer, and a single-period interferometric lithography exposure pair; three-beam interferometric exposure pairs to form sparse arrays of sub-micrometer holes; five- and four-beam interferometric exposures to form a sparse array of sub-micrometer holes in a single exposure. Apparatuses disclosed include arrangements for the three-beam, five-beam and four-beam interferometric exposures.

22 Claims, 16 Drawing Sheets

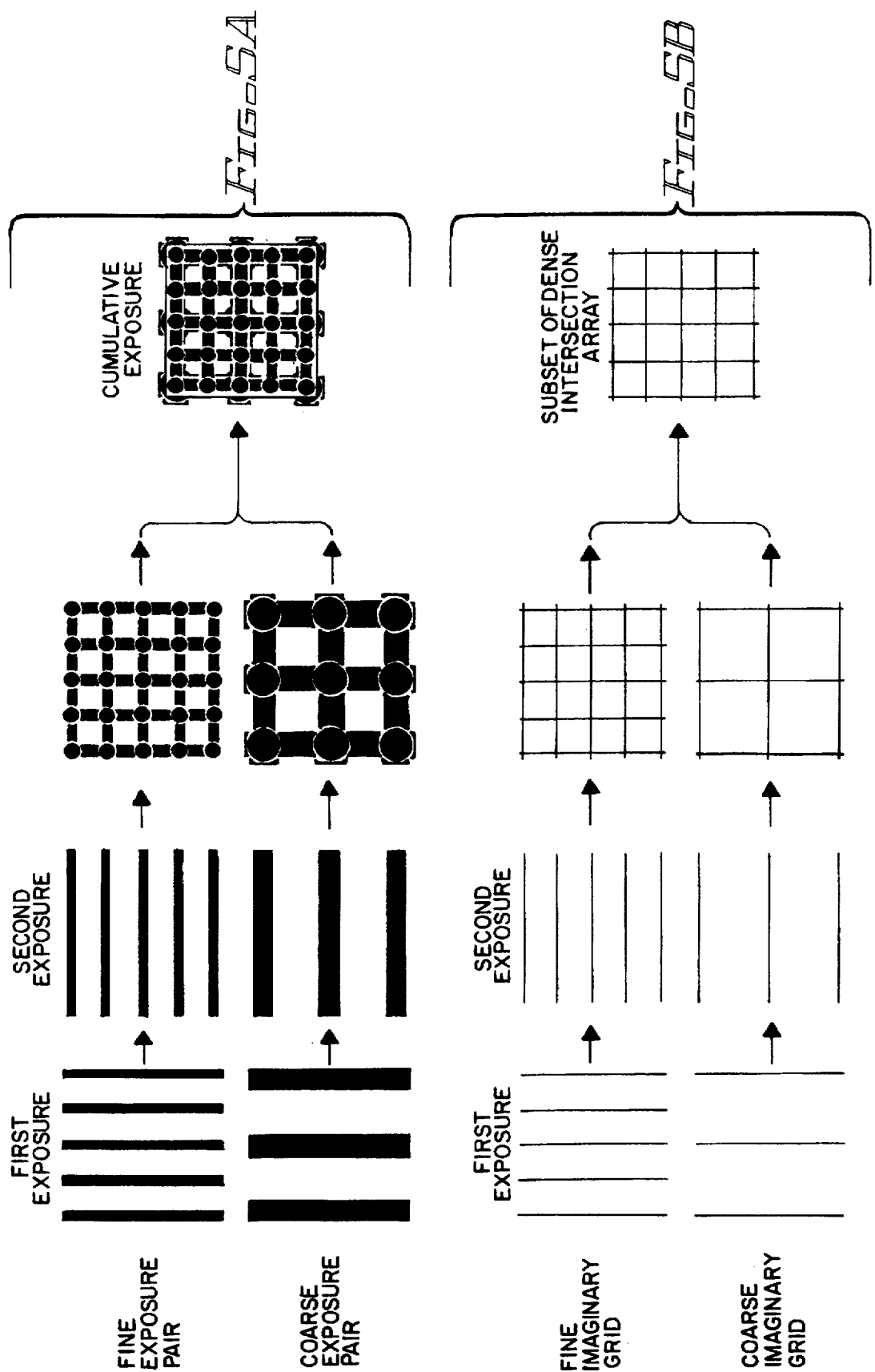

M

M

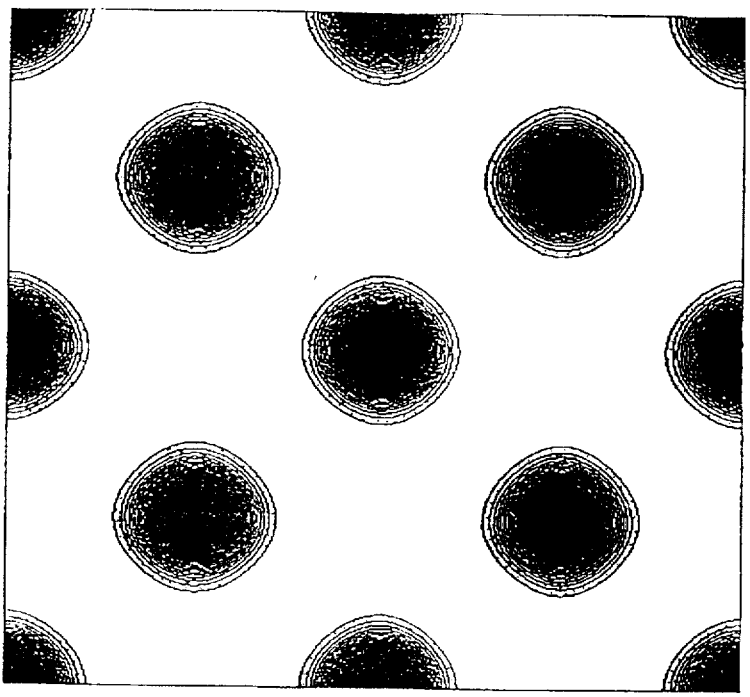
M  FIG.20
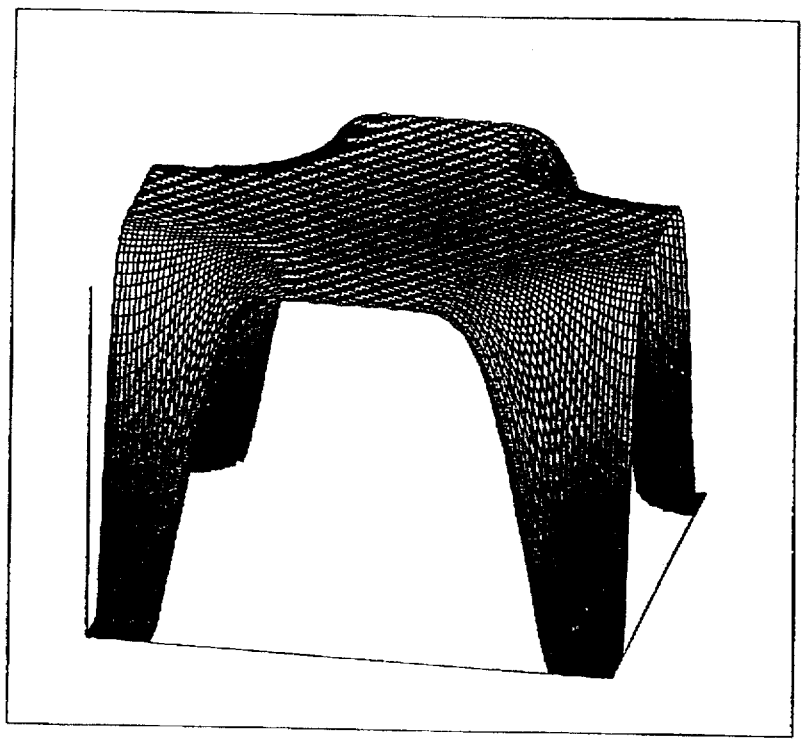
M  FIG.22

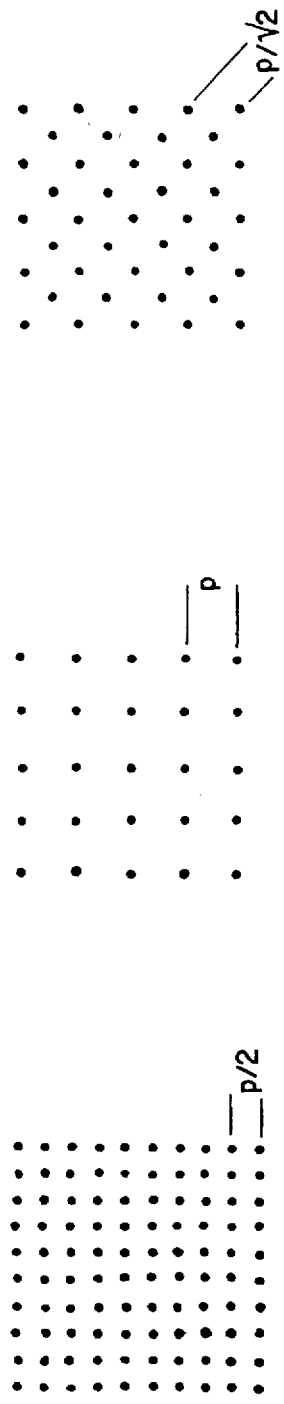
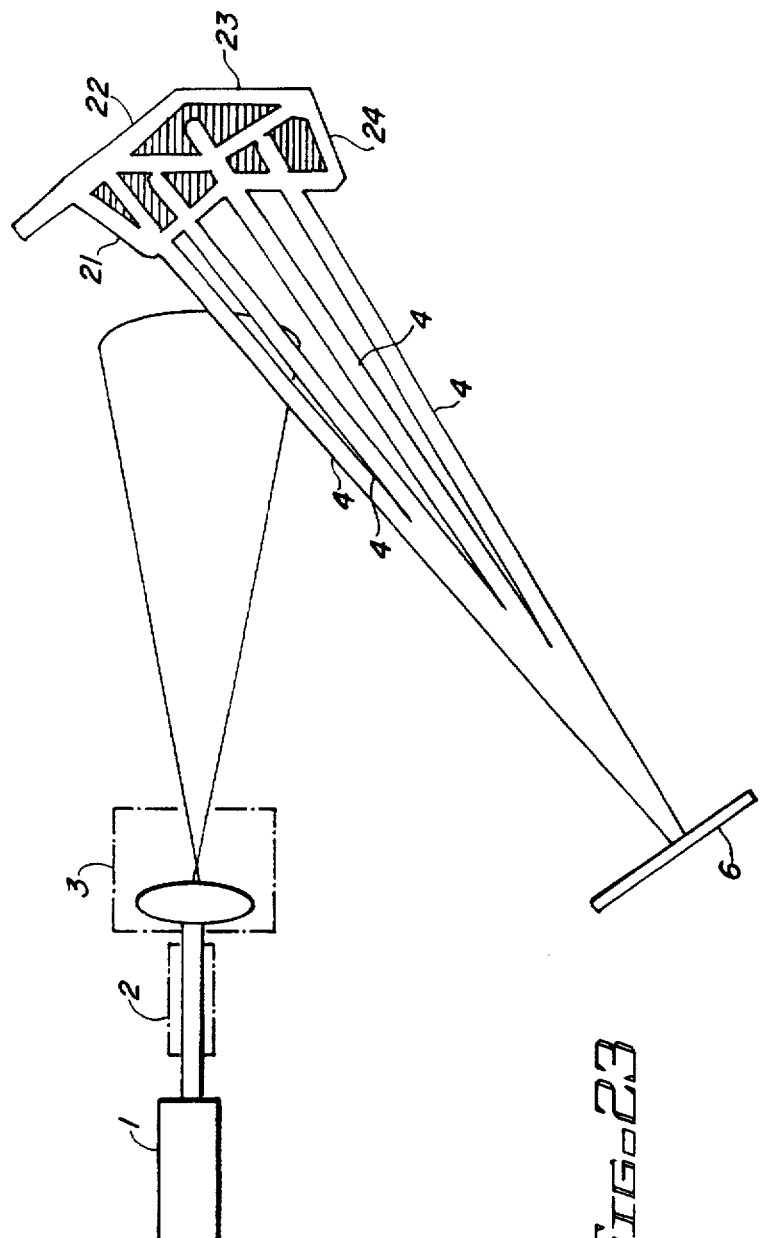
FIG-21a  FIG-21b  FIG-21c
FIG-23

METHODS AND APPARATUS FOR LITHOGRAPHY OF SPARSE ARRAYS OF SUB-MICROMETER FEATURES

This application is a continuation-in-part of application Ser. No. 08/399,381, entitled "Methods and Apparatuses for Lithography of Sparse Arrays of Sub-Micrometer Features" by S. R. J. Brueck et al., Attorney Docket UNM-393, filed Feb. 24, 1995, now abandoned.

BACKGROUND OF THE INVENTION

1. Field of the Invention

The present invention relates generally to sub-micrometer lithography and more particularly to interferometric lithography methods and apparatuses to produce sparse arrays of sub-micrometer features. Applications include field emission devices for vacuum microelectronics and displays, and via holes for VLSI.

2. Description of the Prior Art

The size of lithographic features for electronic and display applications is continually decreasing. The Semiconductor Industry Association (SIA) road map shows critical dimensions (CDs are the smallest patterned lateral feature size on a semiconductor chip) for production tooling decreasing from 0.35 µm in 1995 to 0.10 µm in 2007. Deep-UV optical lithography tools are presently approaching resolutions of 0.35 µm with field sizes of 20–30 mm. These tools have been designed for the flexibility required for logic circuits and the flatness and perfection possible with Si wafers. As a result of the inherent diffractive coupling between lateral resolution and depth-of-field for imaging optical systems, the depth-of-field is necessarily very restricted to about 1.0 µm. Considerable effort is being expended on chemical-mechanical planarization and top-surface imaging resists to accommodate this limited depth-of-field. These tools are inherently very expensive. The SIA road map calls for the development of 0.18-µm CD lithography tools for the 1-Gb DRAM generation expected in 2001. Because of the lateral resolution limitations of imaging optical lithographies, this will require a shorter wavelength source, most likely an ArF laser operating at 193 nm, which will require substantial and expensive research in new resist systems and mask capabilities. The technology road map for even smaller CD tools is unresolved at present.

Interferometric lithography is an alternate approach to sub-micrometer CD lithography that is applicable where the desired structures are largely, but not exclusively, periodic. This technique uses interfering, quasi-monochromatic, coherent laser beams, to write large areas of sub-wavelength structures as discussed in patent application Ser. No. 07/945,776, filed Sep. 16, 1992, now U.S. Pat. No. 5,415,835, and entitled "Method and Apparatus for Fine-line Interferometric Lithography." See also S. H. Zaidi and S. R. J. Brueck, "Multiple Exposure Interferometric Lithography," J. Vac. Sci. Technol. B 11, 658 (1993); and S. H. Zaidi and S. R. J. Brueck, "Multiple Exposure Interferometric Lithography," in Optical/Laser Microlithography VII, T. Brunner, ed. SPIE 2197, 869–875 (1994). Interferometric exposures inherently produce periodic or repetitive structures across the exposed area; aperiodic structures, such as contacts and interconnects, may be added by combining interferometric lithography with imaging optical lithography as discussed in the above references.

For the simplest interferometric exposure consisting of two plane waves symmetrically incident on a photosensitive surface of a plate at angles $\pm\theta$, a grating of period $\lambda/(2\sin\theta)$ is produced. For equal line:space gratings, a CD of 0.1 µm is readily achieved with a commercially available, 364-nm wavelength, Ar-ion laser ($\theta=65°$) using already developed and optimized deep-UV resists. Larger CD structures are also readily achieved with the same laser source at smaller angles. Two exposures with the plate (or the optical path) rotated by $\psi=90°$ between exposures gives a rectilinear array of holes (as in Cowan U.S. Pat. No. 4,402,571). This pattern can be visualized as a set of holes whose centers fall on an imaginary array of points formed at the intersections of two sets of parallel lines, one set of lines corresponding to the centers of the first grating lines and the second set of lines corresponding to the centers of the grating lines of the second exposure with the plate rotated relative to the optical path in other words, the holes are formed with their centers substantially on only a subset of the set of intersections of two mathematically-defined, equally-spaced, parallel arrays of lines, the first array of lines oriented parallel to and defining the x-axis, and given by the set of equations $y=N\delta_x$ where N is an integer (N=0, +/−1, +/−2, ... ) and $\delta_x$ is the spacing between the first set of lines, and the second array of lines oriented at an angle $\psi$ to the first array of lines, and mathematically defined by the set of equations $y=\tan(\psi) * (x-M\delta_y)$, where M is an integer (M=0, +/−1, +/−2, ... ) and $\delta_y$ is the spacing between the second set of lines. The exposure fluences, which are a measure of exposure doses, are adjusted so that only in the vicinity of these points is the cumulative exposure sufficient that the development process results in clearing of the photoresist. This is illustrated schematically in FIG. 1. The intensity of the exposure is denoted by the shading of the exposure with a greater exposure corresponding to a darker shade. Generally, more complex structures can be formed by using a larger number of exposures.

Current lithographic practice makes use of both positive and negative tone photoresists, e. g. photosensitive materials for which a developer preferentially removes either the exposed (positive tone) or the unexposed (negative tone) areas. Both types of resist are in common use in microlithography. The role of holes and of mesas is reversed when the resist tone is reversed. For definiteness, this specification is written for a positive resist and refers to arrays of holes; however, the extension to negative resists and to arrays of mesas is within the state-of-the-art and is within the scope of this specification.

A dense array is defined herein as an array with a line:space ratio varying between 1:0 and 1:2; measured along the line in the plane of the array with the lowest line:space ratio. A dense array with a line:space ratio of 1:1.5 of 0.4-µm diameter holes on a 1-µm pitch is shown in the scanning electron micrograph (SEM) of FIG. 2. This array was produced in a photoresist film on top of a metal layer using interferometric lithography with 488-nm wavelength laser beams at angles of incidence of $\theta=+14°$ and $-14°$. A positive tone photoresist was used so that the holes are the areas of highest exposure where the photoresist was removed in the development process following the exposure. Another example of this technique is shown in FIG. 3 which shows a SEM of a dense array of 0.13-µm diameter holes on a 0.2-µm pitch (line:space ratio of 1:0.54) etched into a silicon substrate. The holes were etched into the Si using a reactive-ion etch (RIE) process following the develop step. The photoresist film serves as a mask allowing etching only in the areas where the resist has been removed by exposure and development. Following the RIE, the remaining photoresist was removed using an oxygen plasma ashing process. For these geometries, the depth-of-field is several tens of centimeters, set by the laser coherence, and is effectively infinite on the scale of the film thicknesses and topographies common in microelectronic and/or display fabrication. Only simple, low-NA optics (primarily inexpensive flat mirrors) are required for achieving these very small CDs. Importantly, this ~0.1-μm CD employs only presently existing, well-developed laser sources and photoresist systems.

The pattern density is an important, application-specific parameter. In some applications such as investigations of the optical and electronic properties of quantum structures, it is desirable to have as dense an array as possible. This is readily provided by the prior-art interferometric lithography techniques where approximately equal line:space gratings are produced. In many other applications, however, a much less dense structure is desirable. In the emerging field of vacuum microelectronics, for example, it is desirable to have sparse arrays of holes (a line:space ratio of 1:3 or larger e. g. 1:4) for the fabrication of field emitter tips with apertures in the range of 0.1 to 0.5 μm. Field emitter tip arrays have applications to flat panel displays and microwave devices. In the context of a square, two-dimensional array of holes, the line:space ratio is the hole diameter:space between holes distance ratio. Larger ratios mean smaller holes for the same pitch or a larger pitch for the same hole diameter. The hole diameter:pitch ratio measures the pitch or periodicity of the holes in hole diameter units. A line:space ratio of 1:3 commonly used in lithographic terminology would then be a hole diameter:pitch ratio of 1:4.

The most promising new technology for fabricating flat panel displays is based on Spindt-type field emitters. The basic operating principal of this field-emission cathode is the creation of a large electric field in the vicinity of the emitter tip by controlling the sharpness of the tip and the tip-gate electrode proximity. The sharpness of the emitter is determined by the process technique used to form the emitter, while the gate-to-emitter distance is limited by the resolution of the lithographic tool. The higher the lithographic resolution, the smaller the gate-to-emitter distance and the lower the turn-on voltage, a critical parameter for field emission displays (FEDs) that strongly affects both the overall efficiency and the cost of the driver electronics.

Sub-micrometer gate holes for the emitter tips increase the emitter density and, thereby, reduce the display pixel size for a given number of emitters per pixel. FED reliability is also improved by sub-micrometer gate holes since the volume of material in each emitter tip is directly related to the size of the hole. A typical emitter failure is caused by a sudden surge in current followed by evaporation and ionization of the tip material. This vaporized material can contaminate nearby emitters as well as potentially trigger an anode arc which can destroy a large number of nearby emitters. Reducing the volume of material in each emitter tip minimizes the probability of this catastrophic failure mechanism.

Whether a failed emitter affects the operation of neighboring emitters depends on the amount of material ejected, the distance to the nearest neighboring emitters, and the stored capacitive energy. The radial distance affected by a single emitter failure was found to be 2.5 μm for a 1.0 μm gate hole diameter. For a dense array of holes, e.g., a 1:1 line:space ratio, a failure of one emitter can trigger the destruction of its neighbors and possibly propagate throughout the array. A sparse array of holes is, therefore, necessary to prevent random failures from propagating. Additional advantages to the sparse hole patterning are a reduction in the tip-gate capacitance and in the gate-emitter leakage currents because of the possibility of undercutting the gate oxide in the fabrication process. This indicates the importance of sparse hole patterning of sub-micrometer holes. Typical interferometric lithography techniques result in a 1:1 line:space ratio. The methods of the present invention will produce sparse arrays of sub-micrometer holes over large areas, ideally suited to the manufacture of Spindt-type FEDs.

Another application of sparse arrays is lithography for the formation of via holes for silicon integrated circuit manufacturing. Via holes are fabricated in dielectric layers over metal patterns and filled with a metal plug to make electrical contact between different metalization levels. The lithography for these via holes is among the most demanding levels for the manufacture of integrated circuits. The density of these via holes is set by the circuit design and layout, and typically involves small holes (at the smallest CDs) separated by much larger distances. Again, this demands a technique for sparse or isolated structures (large line:space ratios).

Holes in a photoresist layer corresponding to any line:space ratio can, in principle, be formed by adjusting the exposure dose in relation to the develop parameters in single-period interferometric lithography exposure pairs (one exposure with lines of constant dose parallel to the (arbitrary) x-axis and a second exposure with lines of constant dose perpendicular to the x-axis along the y-axis). The peak exposure dose of each of the two exposures is less than the dose required to develop completely through the resist, clearing dose $F_r$, while the sum of the peak exposure doses for the two exposures is larger than $F_r$. Thus, the sites where the lines of peak exposure intersect receive an exposure dose above $F_r$. When the photoresist is etched by contact with a developer, these points of intersection become holes. The diameter of the holes (i. e., the line:space ratio) can be adjusted by varying the exposure doses. A larger dose will result in a larger diameter hole or a smaller line:space ratio. If the two exposures are at the same pitch and intensity, a square array of circular holes will result. If the periods of the two exposures are different, a rectilinear array will result. If the periods are the same, but the exposure doses are different, a square array of elliptical holes will result. This method is similar to that of Cowan, U.S. Pat. No. 4,402,571. However, it should be noted that Cowan's invention was directed towards contoured photoresist films, i.e. towards obtaining a linear dependence of the developed photoresist thickness on the exposure fluence whereas the present invention is directed towards a nonlinear response with as rapid as possible a transition from a full photoresist thickness in the exposed regions to a cleared photoresist exposing the substrate within the holes, thus the "effective threshold of linear response" defined by Cowan is substantially lower than $F_r$.

However, there are limitations to this approach. The process latitude or tolerance of a manufacturing process to process variations (laser intensity, photoresist sensitivity, photoresist thickness, underlying reflectivity, etc.) is not constant across the entire processing space; and, in particular, is significantly lowered for large line:space ratios. The process latitude has an important direct correlation with product yield and, hence, an inverse correlation with manufacturing cost per part. A sufficient process latitude is essential for cost effective manufacturing.

This can be demonstrated by a simple argument. For a single-period interferometric lithography exposure pair, the exposure fluence as a function of position is given by:

$F(x,y)=4F_1[\cos^2{(kx \sin \theta)}+\cos^2{(ky \sin \theta)}]=2F_1[2+\cos{(2kx \sin}$ θ)+cos (2ky sin θ)]     (1)

where: $F_i = I_i t_i$ is the fluence (intensity×duration) of the exposure for each individual beam incident on the sample; $k=2\pi/\lambda$ with $\lambda$ the laser wavelength; and θ is the angle of incidence. For nonrectilinear structures (i. e., when the sample or the optical system is rotated by some angle other than 90° between exposures), a more complex analysis is required although the basic concepts are unchanged. The hole diameter (w) is just given by evaluating the region of space for which $F(x,y) > F_r$. Simple algebra gives:

$$w/p = \frac{2}{\pi} \cos^{-1} [\sqrt{F_r/4F_1 - 1}]  \quad (2)$$

where $p=\lambda/(2\sin\sigma)$ is the period. This result is plotted in FIG. 4 as the curve labeled "single period exposure pair." The very large slope just as the resist begins to clear ($F_1/F_r \sim 0.125$) means that the hole diameter will be very sensitive to process variations in this regime. In contrast, for larger fluences ($F_1/F_r \sim 0.17$; 1:1 line:space ratio) the slope is much lower and the lithography much less sensitive to process variations. For still higher fluences, the holes merge together (at a $F_1/F_r = 0.25$) and the line:space ratio is again very sensitive to process variations. The 1:1 line:space ratio is near optimal in terms of process sensitivity.

A related problem to the sensitivity to exposure variations is the shape of the resist profile following the exposure and develop steps. Too shallow a resist slope will make the hole diameter susceptible to variations in the etch step following the lithography. Because the exposure pattern associated with interferometric lithography (Eq. (1)) is a relatively slowly varying sinusoidal function, cos (2kx sin θ); we rely on nonlinearities in the exposure and development processes to sharpen the profile. The resist profiles resulting from the exposure and develop steps can be estimated with a simple model presented by Ziger and Mack (*Generalized Approach toward Modeling Resist Performance*, AIChE Jour. 37, 1863–1874 (1991)). Neglecting post-exposure bake film thickness loss and surface inhibition effects, they give a simple expression for the photoresist thickness following development as:

$$t(x) = 1 - \left[ \frac{1 - e^{-F(x)/F_t}}{1 - e^{-1}} \right]^n  \quad (3)$$

where n is "a coordination number for the average number of base soluble groups that act in concert to affect solubility rate" and is typically ~5 for Novalak resists. The top curve in FIG. 5 shows the results for the calculated resist profile for 0.5-μm diameter holes on a 2-μm pitch. The other curves in the figure pertain to different exposure conditions that are the subject of this invention and will be discussed below. The important point to note is that the slope of the sidewall is significantly less than the ideal 90° for the single exposure curve.

The current method of producing arrays of sub-micrometer holes in photoresist layers using interferometric lithography exhibits an increasing process sensitivity as the line:space ratio is increased. Specifically, this sensitivity is three times higher for the 1:3 line:space ratios desired for sparse hole arrays for field-emitter tip array fabrication than it is for 1:1 line space ratios. We have developed several techniques to address this issue and produce sparse hole arrays with significantly more process latitude than is available from single period interferometric lithography exposure pairs (one for the x-direction, one for the y-direction).

OBJECTS OF THE INVENTION

It is therefore an object of the present invention to provide techniques to produce sparse hole arrays of sub-micrometer dimensions with significantly more process latitude than is available from single-period interferometric lithography exposure pairs (one for the x-direction, one for the y-direction) such that holes are formed centered on only a subset of the set of intersections of two mathematically-defined, equally-spaced parallel arrays of lines, the first array of lines oriented parallel to and defining the x axis and the second array of lines oriented at an angle ψ to the first array of lines.

Another object of the present invention is to produce sparse hole arrays of sub-micrometer dimensions using four interferometric lithography exposures with two different pitches in each direction.

Still another object of the present invention is to produce sparse hole arrays of sub-micrometer dimensions using four interferometric lithography exposures with processing steps between the first pair (one in x, one in y) of lithography exposures and the second pair of lithography exposures.

A further object is to produce sparse hole arrays of sub-micrometer dimensions using multiple exposures combining interferometric lithography for the small features and conventional optical lithography for the larger features.

Another object of the present invention is to provide a device and method which is capable of patterning sparse hole arrays of sub-micrometer dimensions using three beams for two exposure pair (one in x, one in y) formation of a sparse hole array.

An additional object of the present invention is to provide a device and method which is capable of patterning sparse hole arrays of sub-micrometer dimensions using five beams for a single exposure formation of a sparse hole array.

A further object of the present invention is to provide a device and method capable of patterning sparse hole arrays of sub-micrometer dimensions using four beams for a single exposure formation of a sparse hole array while, at the same time, retaining a very large depth-of-field.

SUMMARY OF THE INVENTION

Methods and apparatuses are disclosed for producing sparse arrays of sub-micrometer holes and/or mesas in a photosensitive material on a substrate, where sparse arrays refer to hole/mesa diameter to inter-hole/mesa ratios (referred to as line:space ratios) of 1:3 or larger. Interference between coherent laser beams is a convenient technique for producing large-area arrays of periodic structures including hole/mesa arrays. However, for the prior art technique of using a single exposure pair (for defining the pattern in two nominally orthogonal directions in the plane of the substrate) the process latitude, i.e. the manufacturing tolerance to process and material variations, is optimal for line:space ratios of about 1:1 and is substantially reduced for sparse arrays. Six related interferometric lithography methods are disclosed for providing improved process tolerance for the production of sparse arrays. These include: (1) double exposure interferometric lithography pairs at pitches of p and p/2 in the same level of photoresist; (2) double exposure interferometric lithography pairs at pitches of p and p/2 and use of two levels of photoresist with intermediate processing; (3) combined optical lithography (for micrometer-sized structures) and interferometric lithography (for sub-micrometer-sized structures) either in the same level of photoresist or in two levels with intermediate processing steps; (4) three-beam interferometric lithography pairs for direct exposure of a sparse array; (5) five-beam interferometric lithography for simultaneous exposure of the complete sparse array of holes/mesas voiding the requirement of rotating the substrate relative to the optical system common to the prior art and all of the other methods, and (6) four-beam interferometric lithography for simultaneous exposure of a complete sparse hole array in a single exposure without any alignment requirements either transverse or longitudinal. Variations in complexity and alignment, in required exposure dose, and in process tolerance between the various methods are discussed. Apparatuses are disclosed for the three-beam, five-beam and four-beam interferometric lithography methods.

BRIEF DESCRIPTION OF THE DRAWINGS

FIG. 5: Schematic representation of a two exposure pair sequence for forming a sparse array of holes at a subset of the matrix of all intersections of the imaginary sets of lines corresponding to the finest period exposure pair.

FIG. 20: Calculated photoresist profile contour plot (false shading: black is resist totally removed, white is full thickness of resist remaining) following exposure and develop steps for the four-beam geometry.

FIG. 21: Schematic representation of the centers of the arrays of holes for (a) a dense array; (b) a three-beam pair or five-beam exposure, and (c) a four-beam exposure.

FIG. 22: Three dimensional perspective plot of the photoresist profile after development for the four-beam exposure. The coordinate system has been rotated for a direct comparison with FIG. 18 for the five-beam exposure.

FIG. 23: Apparatus for four-beam exposure to produce sparse hole arrays.

DESCRIPTION OF THE PREFERRED EMBODIMENTS

Five related interferometric lithography methods are proposed to fabricate sparse hole arrays. These are: (1) double exposure pairs with two different pitches in each direction; (2) double exposure pairs with processing steps between lithography steps; (3) combined optical and interferometric lithography; (4) three-beam interferometric lithography configuration for exposure pairs (one in x, one in y) of a sparse hole pattern, (5) five-beam interferometric lithography configuration for a single exposure to form a complete sparse hole array; and (6) four-beam interferometric lithography for a single exposure without any required alignment either transverse or longitudinal. Each of these is discussed individually. Hereinafter, a single interferometric exposure pair refers to one exposure for the x-direction and one exposure for the y-direction. A double exposure pair refers to two exposures in the x-direction and two in the y-direction.

(1) Double Exposure Pair With Two Different Pitches in Each Direction

Figure 6:
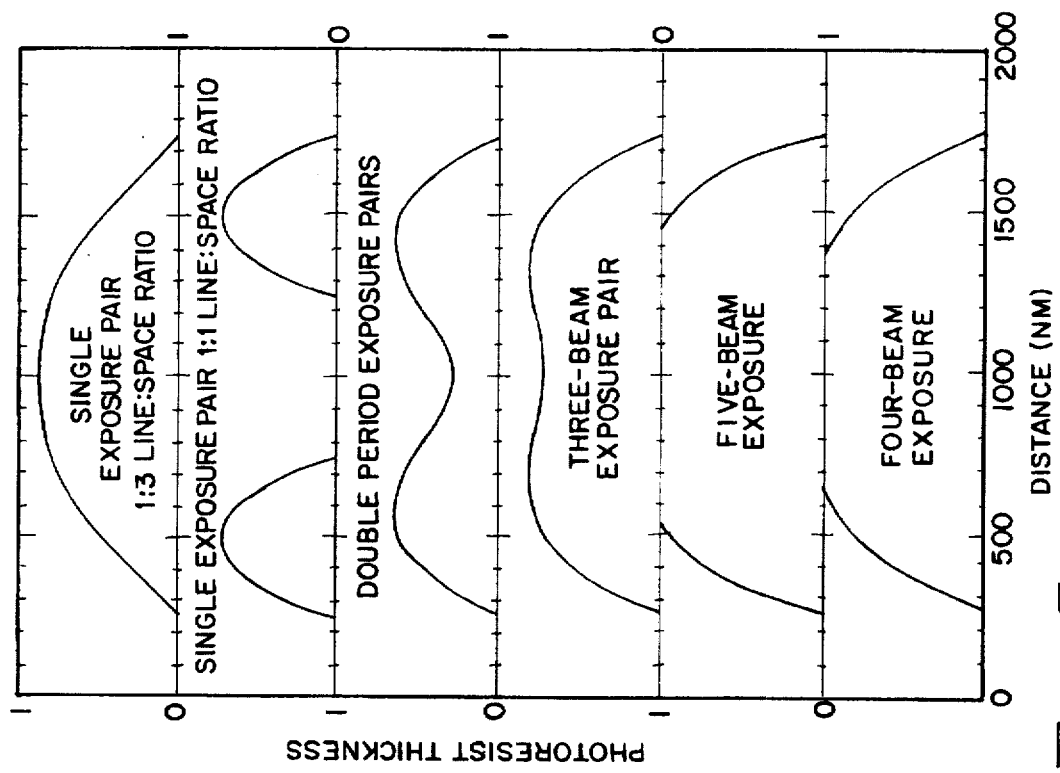
FIG. 6: Calculated resist profiles for five different exposure patterns.

Two exposure pairs may be used where the desired holes are to be formed only in the regions where the combined fluence of the two exposure pairs add to more than the clearing dose. For example, a first exposure pair may be made at a fine pitch (for example 1 µm) and a following second exposure pair at twice this pitch (e. g., 2 µm). With the exposure doses adjusted so that only every other exposed region of the double exposure pair process is developed all the way through the photoresist. In other words, the first exposure pair produces fluence maxima or peaks in the photosensitive material with a one micrometer pitch at the intersection points of the x and y interferometric patterns. The second exposure pair produces similar fluence maxima but at a two micrometer pitch. The 2-µm pitch fluence maxima are aligned with the 1-µm pitch maxima of the first exposure pair. Where the 2-µm pitch maxima add to the 1-µm maxima (at every other 1-µm peak), the cumulative fluence is designed to provide a clearing dose. Since the photoresist is sensitive only to the summation of the intensities from these temporally separated exposures, any order of the exposures may be used. That is, the coarse and fine pitches may be interchanged and both coarse and fine exposures may by carried out in the x-direction before the sample or optical system is rotated to expose patterns in the y-direction. One such sequence is represented schematically in FIG. 5. The exposure fluence as a function of position is given as:

$$F_{double}(x,y)=4F_1[\cos^2(kx \sin \theta_1)+\cos^2(ky \sin \theta_1)]+4F_2[\cos^2(kx \sin \theta_2+\phi_x)+\cos^2(ky \sin \theta_2+\phi_y)] \quad (4)$$

Where the subscripts refer to the respective exposures and the phase of the first exposure has been set to zero without loss of generality. Adjusting the angles so that $\sin \theta_2=2\sin \theta_1$ and the alignment so that $\phi_x=\phi_y=0$ gives the desired pattern. The curve labeled "double period exposure pair" in FIG. 6 shows the predicted photoresist profile for $F_1=F_2$ with the exposure adjusted to give a 1:3 line:space ratio. Note the more nearly vertical sidewall for this exposure pattern.

Figure 4:
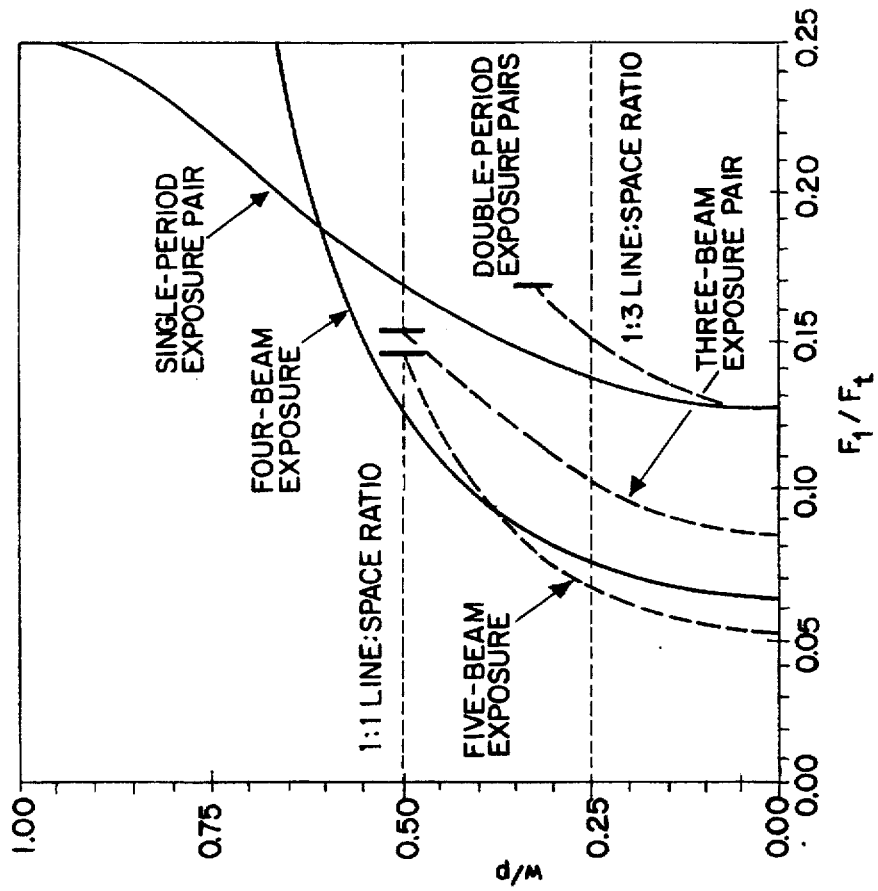
FIG. 4: Calculated hole diameter vs. exposure fluence.

The process latitude is also increased in this exposure over that of the single exposure case as is shown in FIG. 4. The curve extends only to a fluence of 0.167 because the dip in the center of the photoresist profile from the higher spatial frequency exposure breaks through to the substrate at this value. At higher fluences, the sparse hole array will be interspersed with unwanted smaller holes.

Figure 7:
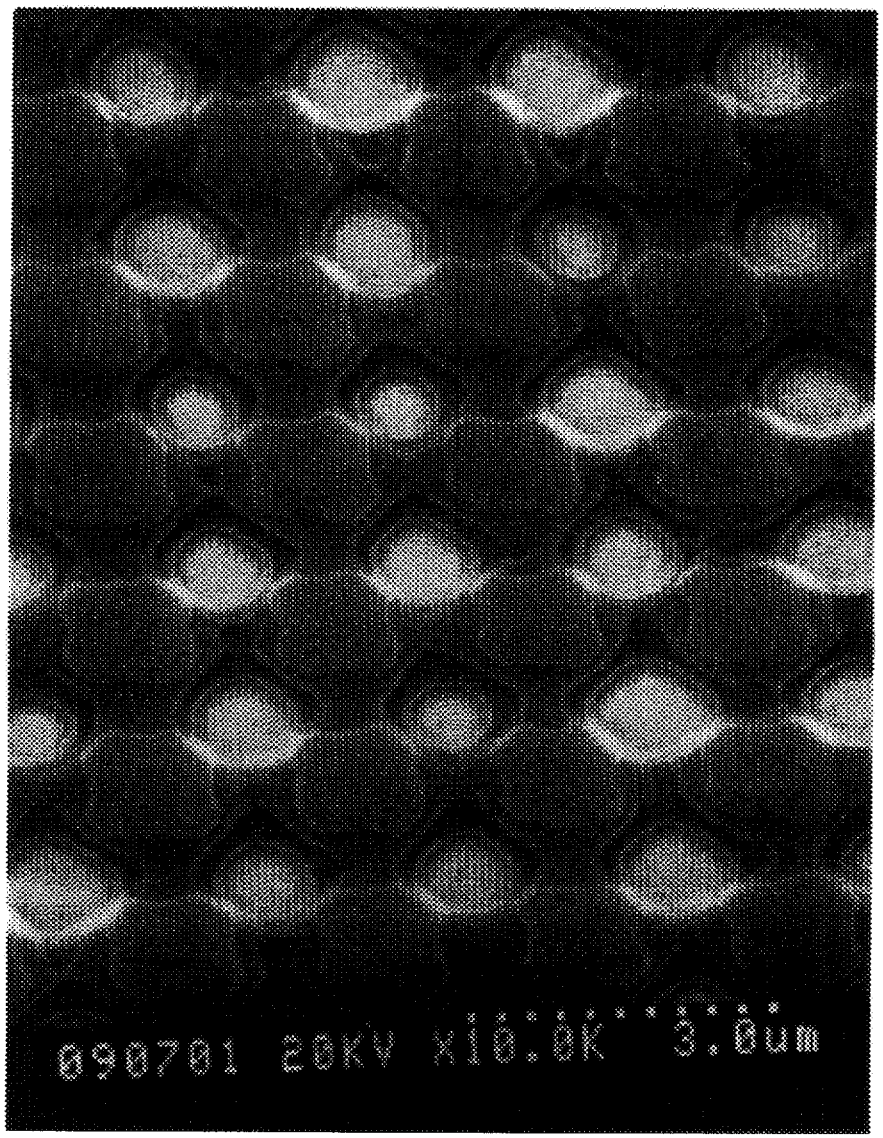
FIG. 7: Sparse array of holes produced by double-exposure in single level of photoresist.

We have developed and demonstrated moiré alignment techniques, akin to those in the two University of New Mexico patents (U.S. Pat. Nos. 5,216,257 and 5,343,292), to match the grating periods (i. e. $\theta_2 = \sin^{-1}(2\sin \theta_1)$) over the full area of the exposures (1 part in $10^6$) and to overlay the two exposure areas to better than 100 nm ($\phi_{x,y} < 18°$). In this case, the alignment signals were derived from latent image diffraction gratings formed in the first exposure. FIG. 7 shows a scanning electron micrograph (SEM) of a double exposure pair (two in x, two in y) pattern in a photoresist film on a Si wafer providing 0.5-µm diameter holes on a 2-µm pitch. The plateaus apparent in the figure are standing wave patterns in the 0.5-µm thick resist. These can be eliminated with an AR-coat layer and, in any case, will not print in the following etch step.

(2) Double Exposures With Processing Steps Between Lithography Steps

Figure 8:
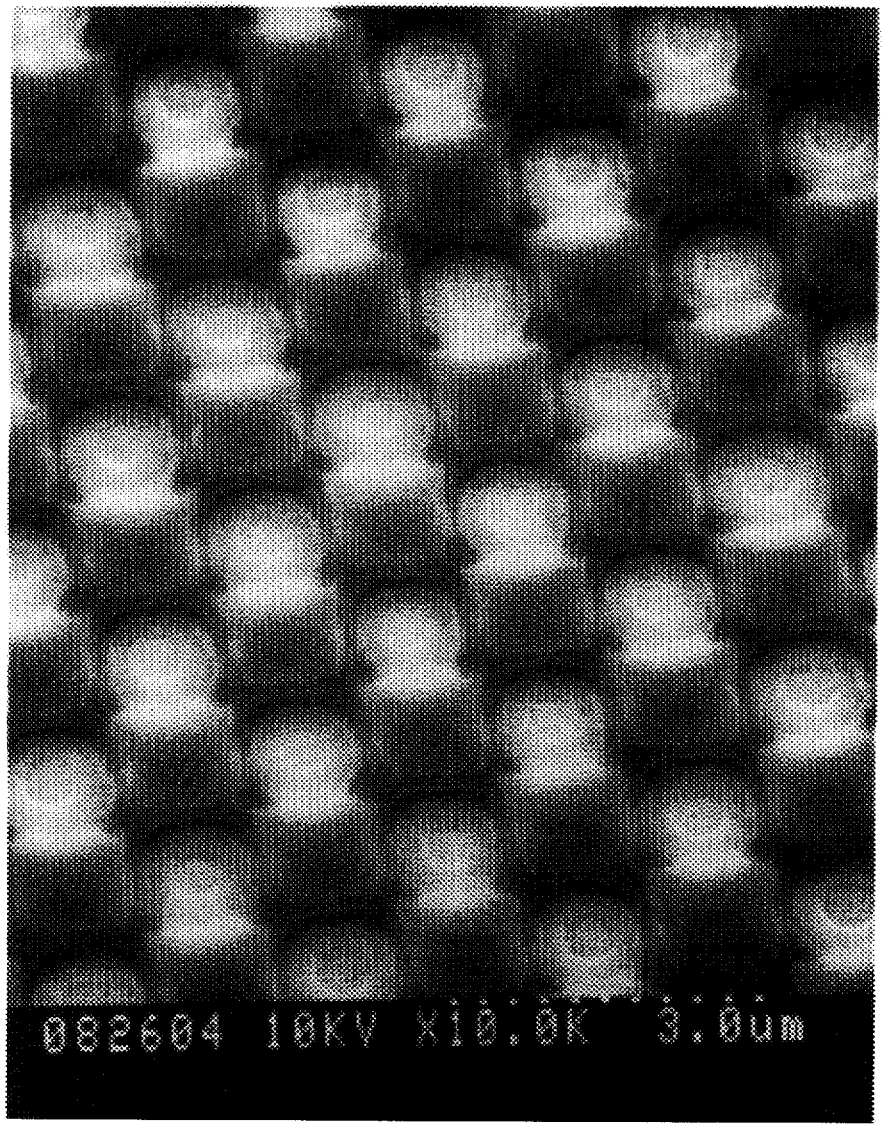
FIG. 8: Sparse array of holes produced in a multi-step process.

In the example shown in FIG. 8, we began with a more complex film stack on top of the Si including a metal film, an oxide layer and a first photoresist layer. We printed a dense array of holes (0.4-µm diameter, 1-µm pitch) with a single-period interferometric exposure pair (one exposure in x, one in y) and etched the holes through the 100-nm thick oxide layer using the pattern defined in the photoresist layer by the exposure and develop steps as a mask. Following the etching, the first photoresist layer was stripped from the sample and a second photoresist layer was spun onto the wafer. In a second single-period interferometric lithography exposure pair, larger holes were exposed and developed (1-µm diameter, 2-µm pitch). The undeveloped photoresist will protect against printing the unwanted holes from the first oxide etch step in the following metal etch step. Again, moiré alignment techniques were used to match the periods and phases of the second exposure pair to the first. Alignment signals were stronger because of the stronger diffraction from the etched structures as compared with the latent image features of case (1). The major advantage of this process is the better definition of the small holes allowed by the etching step. The disadvantage is the extra processing required. The process latitude and sidewall slope for this process are those of the single interferometric exposure pair for a 1:1 line:space ratio as indicated on FIGS. 4 and 6. The process latitude for the second exposure is much wider than that of the first exposure since the hole diameter and oxide sidewall angle are formed in the first exposure, develop and etch process sequence.

It will be recognized that many alternate schemes for transferring a first pattern from a photoresist layer to a more robust etch mask are well known to the art. For example, a nitride or other dielectric layer may be used in place of the oxide layer. This invention relates to the method of transferring the pattern resulting from a first interferometric exposure pair and development sequence of a first photoresist layer to a more robust etch mask followed by a second photoresist layer deposition and second patterning using interferometric lithography, all such methods known to the art of transfer of said pattern from said first photoresist layer to said more robust mask layer are incorporated by this example. Similarly, the order of the exposures could be reversed with the coarse-pitch large-area holes defined in the first photoresist step and the smaller diameter, fine pitch holes defined in the second photoresist step.

(3) Combined Optical and Interferometric Lithography

Figure 9:
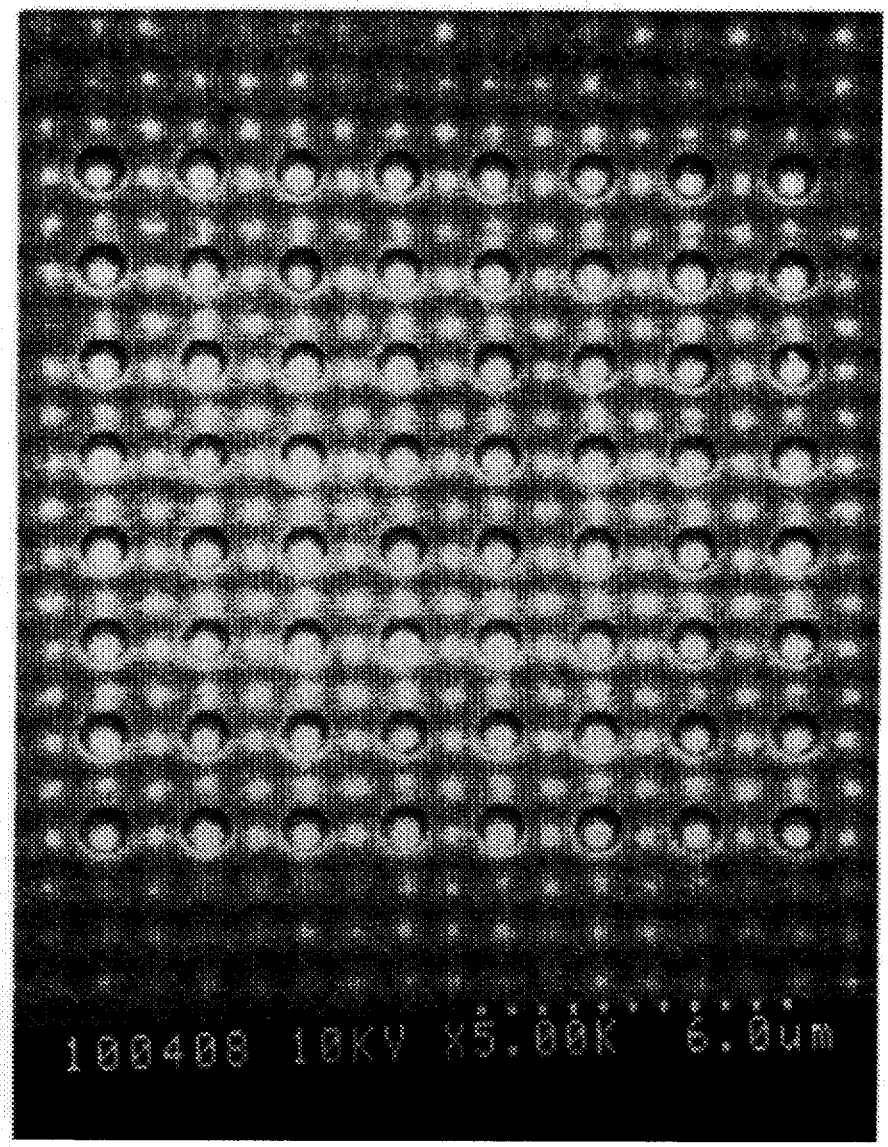
FIG. 9: 8×8 array of 0.4-µm diameter holes written inside array of 1-µm holes produced by optical lithography.
Figure 10:
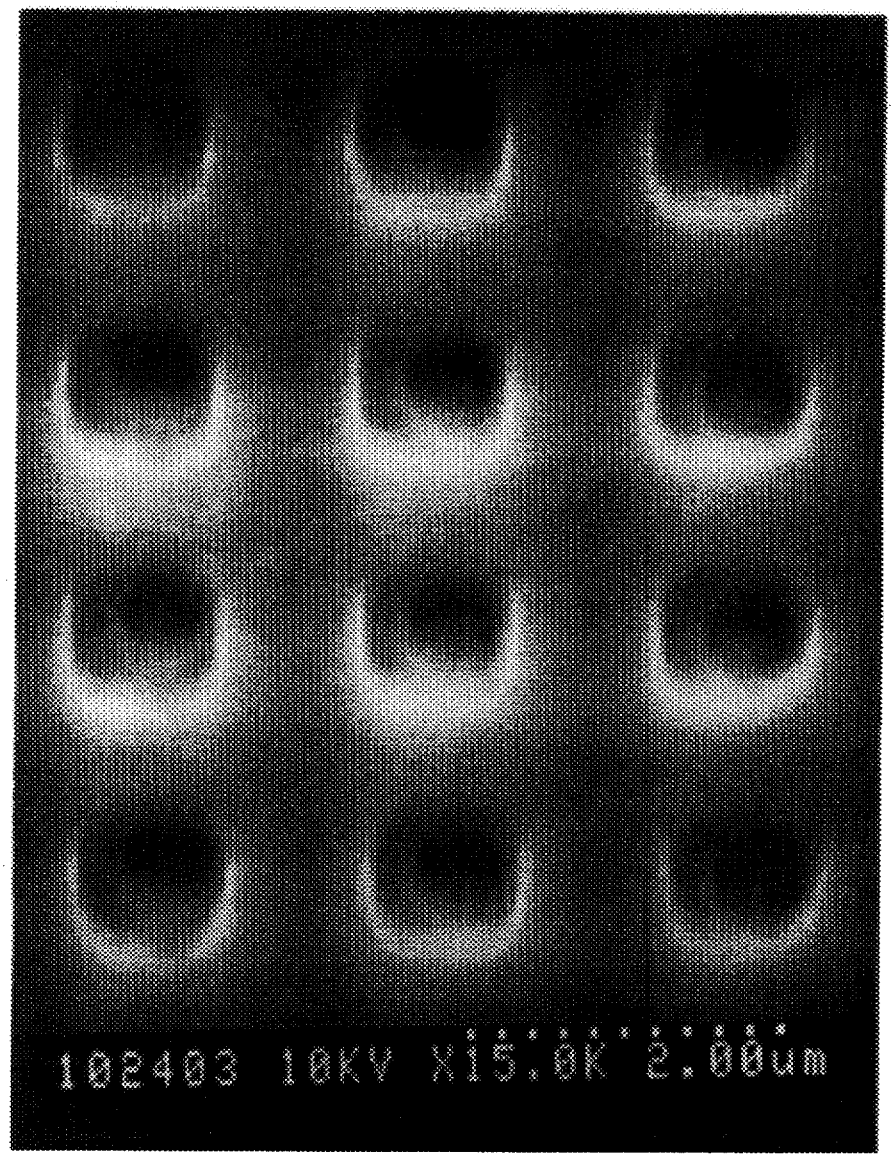
FIG. 10: Sparse hole array by interferometric formation of a dense hole array etched into oxide followed by optical lithography step to isolate every other row and column.

Sparse arrays of sub-micrometer holes can be produced using multiple step processes similar to those of (1) and (2) where interferometric lithography is used to define the small features (e.g., 0.4 µm) combined with conventional lithography for the larger (e.g., 1 µm) features. We have demonstrated both sequences: interferometric lithography followed by conventional lithography and vice versa. Again, the moiré alignment capability inherent in periodic structures is a crucial advantage. Both exposures can be in the same level of photoresist as in (1) or the interferometric exposure and the optical lithography exposure can be in different layers of resist with additional processing steps to transfer the photoresist mask defined in the first exposure and develop processes into a more robust mask material as in (2). FIG. 9 shows an example of the second approach in which small holes were written into a photoresist film on top of an 8 by 8 array of larger "wells" produced in an oxide film by conventional lithography and plasma etching. We have also demonstrated the inverse process in which a dense array of small holes was written and etched into an oxide film and conventional lithography was used to place a larger hole array (1-µm holes on 2-µm pitch) over the original hole. This is shown in FIG. 10. Again, in these processes moiré alignment techniques were used to set the period of the interferometric exposure and align the two sets of holes.

(4) Three-Beam Exposure for Simultaneous Exposure of Two Pitches

Simultaneous multiple exposures at two periods $p_1$ and $p_1/2$ are accomplished by changing the optical arrangement to have three coherent beams of equal intensity ($F_1$) incident at $+\theta$, $-\theta$, and normal to the plate. Straightforward calculation of the field intensity for an exposure pair (one in x, one in y) gives:

$$F_{3-beam}(x) = \quad (5)$$

$$F_1 \left\{ \begin{array}{l} 4[\cos^2(kx\sin\theta) + \cos^2(ky\sin\theta)] + \\ 2 + 4[\cos(kx\sin\theta) + \cos(ky\sin\theta)]\cos(kz(1-\cos\theta)) \end{array} \right\}$$

Figure 1:
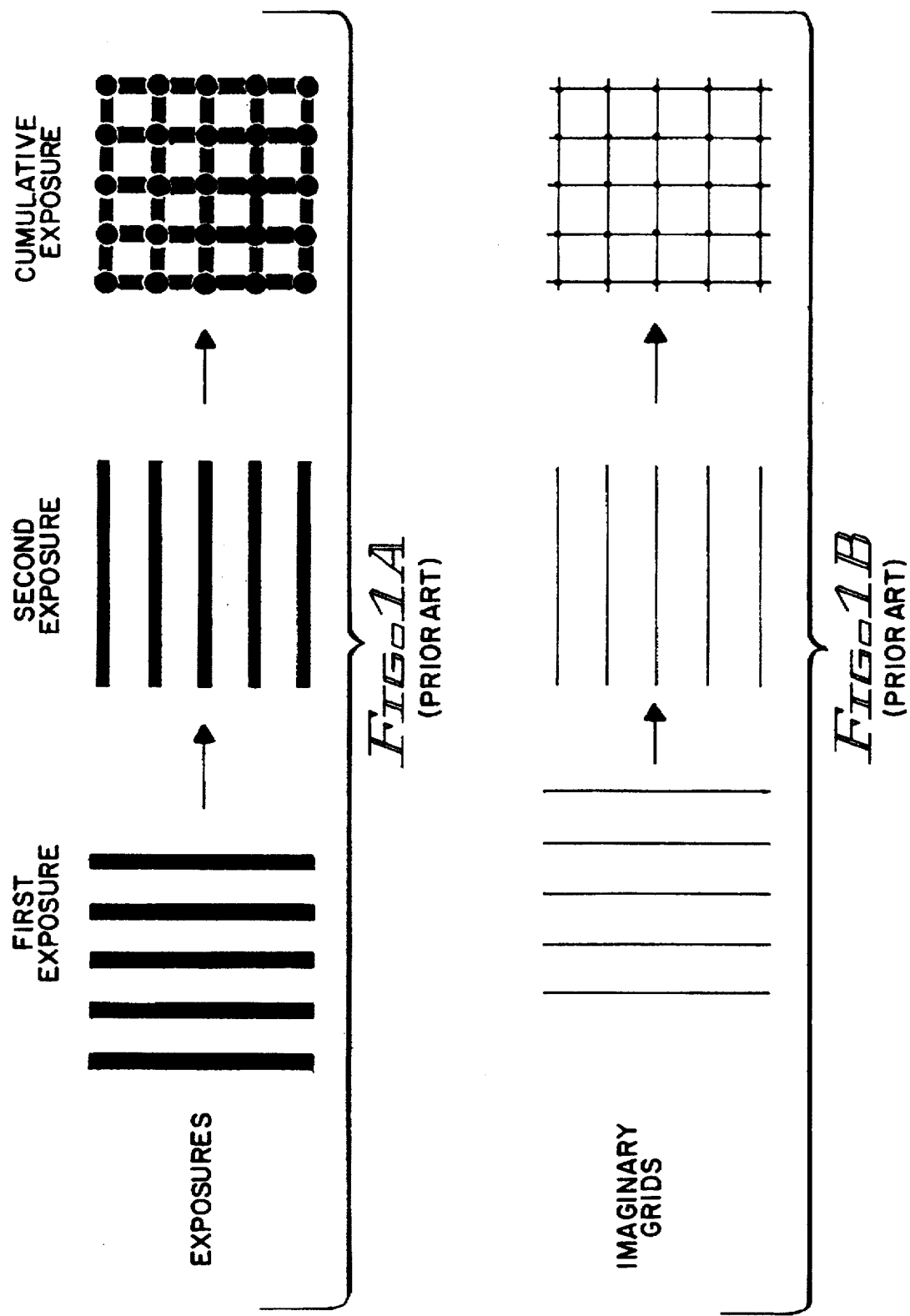
FIG. 1: Schematic representation of the exposure pair sequence for forming an array of holes at each intersection of the imaginary sets of lines corresponding to the two exposures (prior art).
Figure 2:
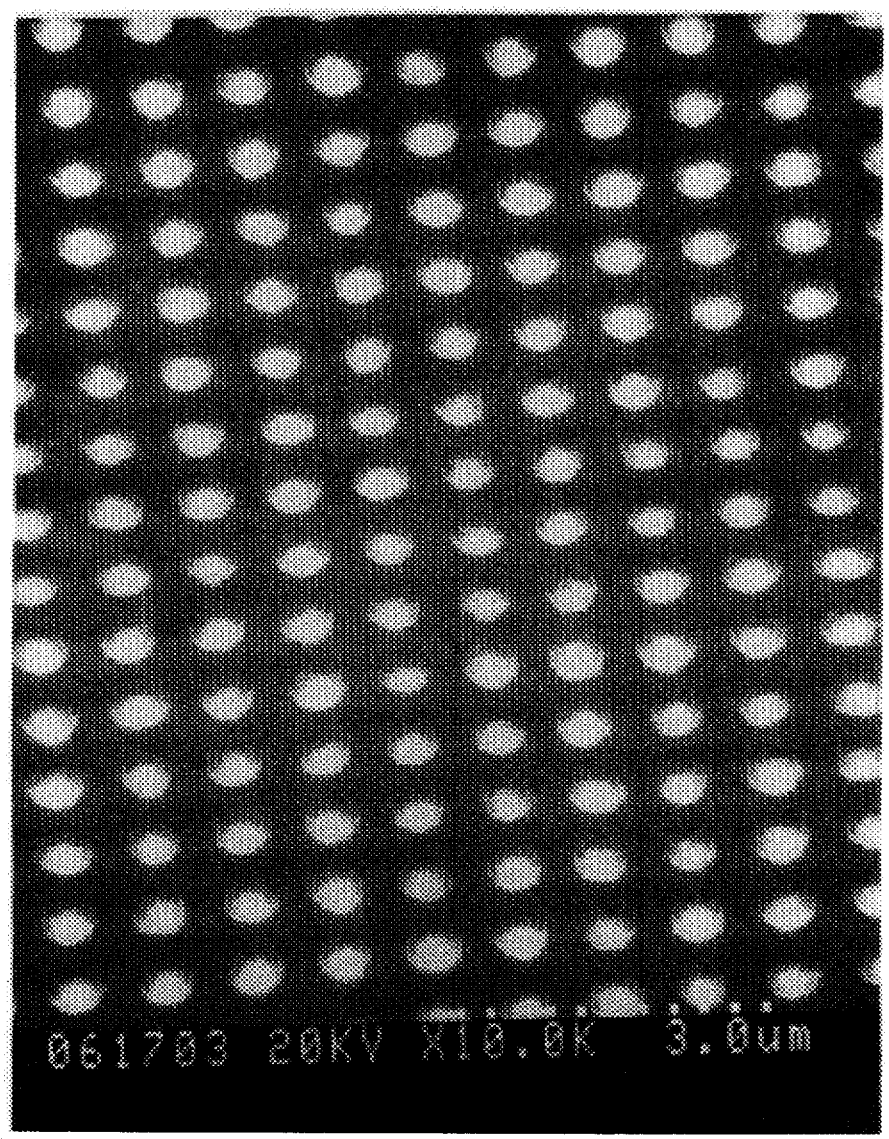
FIG. 2: Dense array (1:1.5 line:space ratio) of 0.4-µm diameter holes on a 1-µm pitch (prior art).
Figure 3:
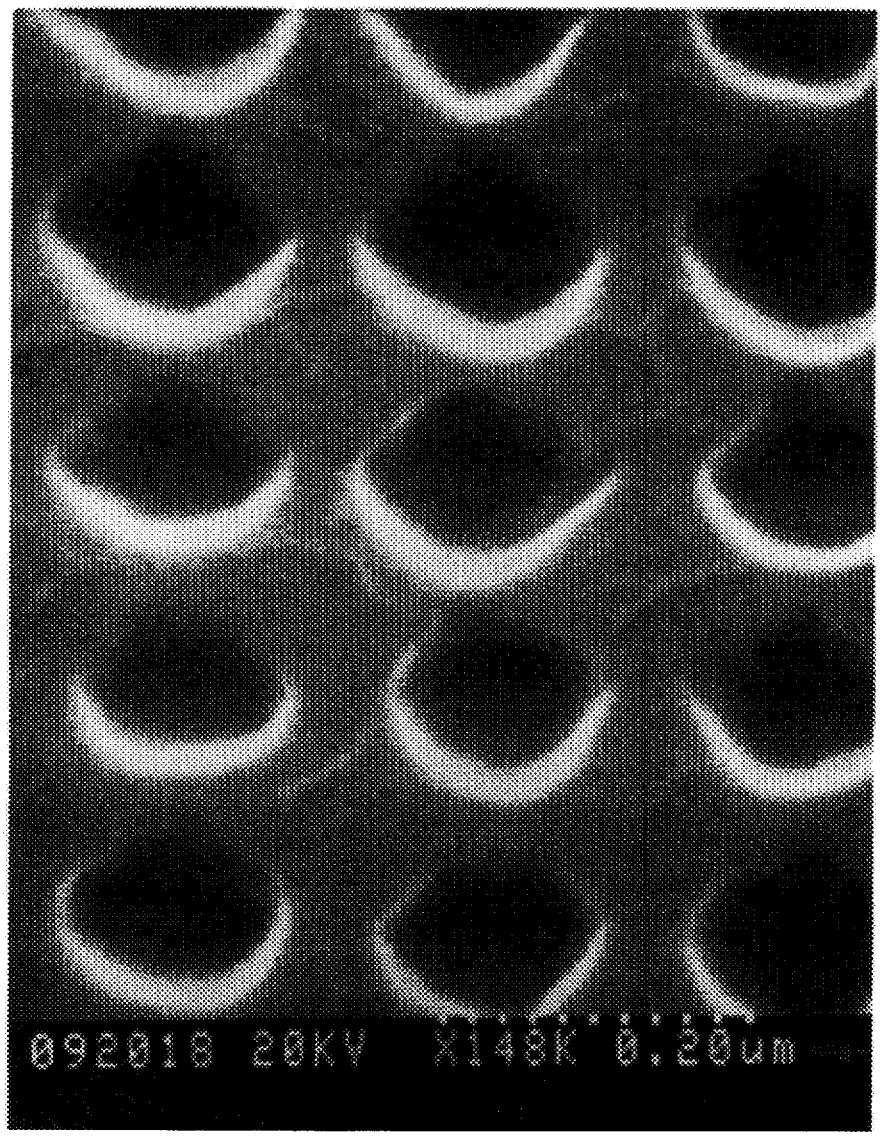
FIG. 3: Dense array (1:0.54 line:space ratio) of 0.13-µm diameter holes on a 0.2-µm pitch etched into silicon (prior art).
Figure 11:
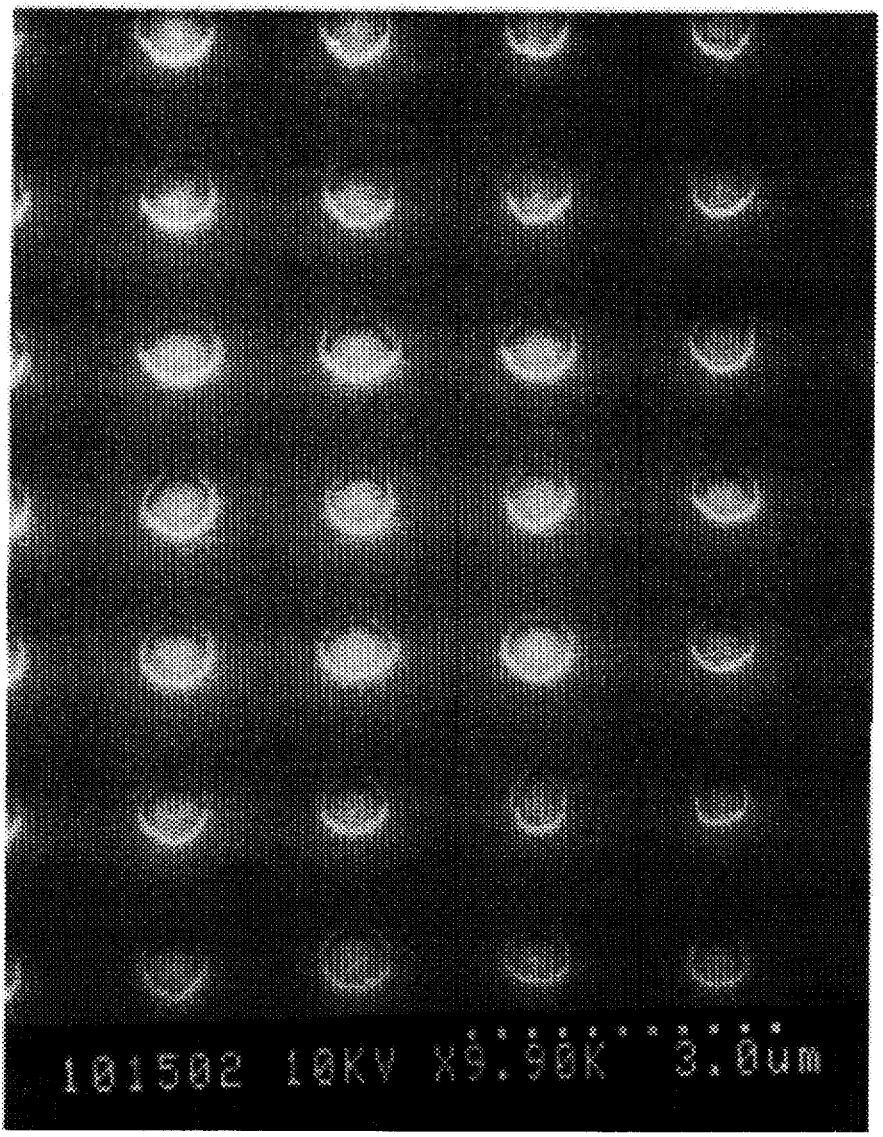
FIG. 11: Sparse array of holes in photoresist written with three interfering beams to simultaneously expose fine and coarse periods.

The first two terms in the brackets are the same as Eq. (1) for the two beam exposure. The additional terms arise from the interference of the third (normal incident beam) with itself (constant term) and with the other two incident beams. Note that there are now components at periods given by $\lambda/\sin \theta$ and $\lambda/2\sin \theta$. Benefits of this method are that there is no lateral alignment required as in the double exposure cases, and the process latitude and photoresist sidewalls are improved over the other techniques. A significant trade-off is that the pattern is no longer independent of z, the distance from the optical system to the wafer or plate (last term in Eq. (6)). This is similar to the finite depth-of-field of imaging optical lithography with the exception that the pattern is repetitive in z rather than only occurring for a small range of z values. Again, the various diffracted orders provide moiré alignment signals so that the z-positioning is a relatively easy task. The small numerical aperture associated with the small angles still leaves a substantial depth of field (~4.6 µm for 0.5-µm holes compared with less than 1-µm for conventional optical lithography at the same CD). The process latitude for this exposure pattern is even better than that of the double exposure (cf. FIG. 4) and the photoresist sidewall angle is similarly improved as can be seen in FIG. 6. The vertical bars in FIG. 4 represent the highest intensity without the production of extra holes; the allowed range of exposures is higher for this three-beam configuration than for the double-exposure pair arrangement. FIG. 11 shows a sample result of this process. A sparse array of holes in photoresist is created in a single exposure pair (one for x, one for y) with only a z-position adjustment. Note that 3.0-µm marker is the same as in FIG. 2.

Figure 12:
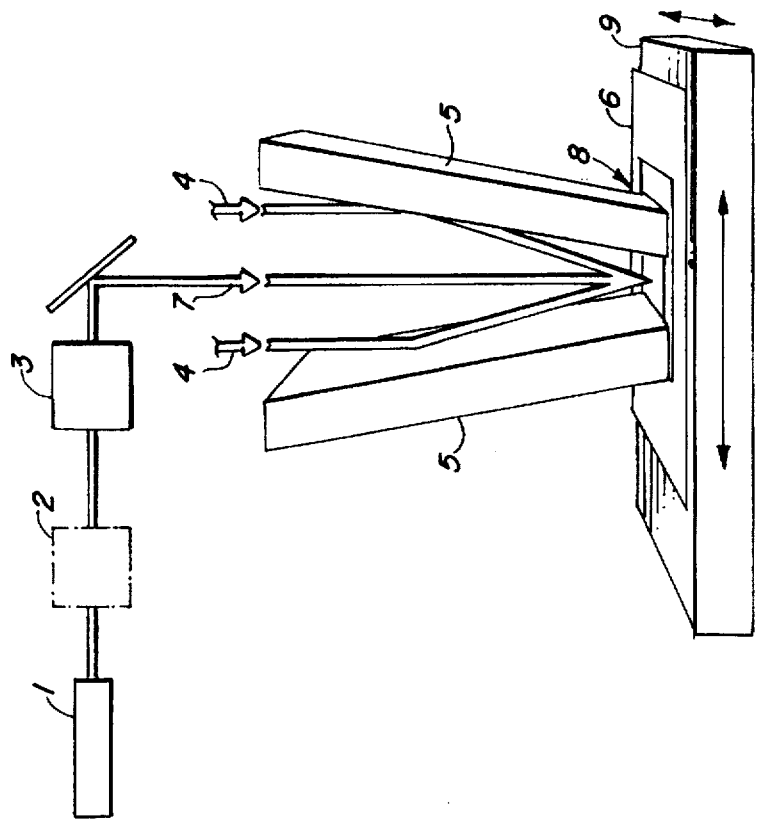
FIG. 12: Apparatus for three-beam exposure to produce sparse hole arrays.

FIG. 12 shows the experimental configuration used for these experiments. A coherent laser source 1, e.g., an Ar-ion laser at 364 nm wavelength, provides a laser beam that passes through an isolator 2 (optional) and beam shaping optics 3. Rays 4 from different parts of the laser beam after shaping are reflected from the fixed position mirrors 5 and combine with the normal laser beam 7 to form the interference pattern at the plate 6 mounted on a translation stage 9. The first exposure is followed by 90° rotation of the plate about an axis perpendicular to the plate surface and a second exposure; alternatively, the optical system may be rotated or a second optical system oriented to expose a pattern at 90° to the first optical system may be used. An aperture 8 restricts the plate area exposed.

Figure 13:
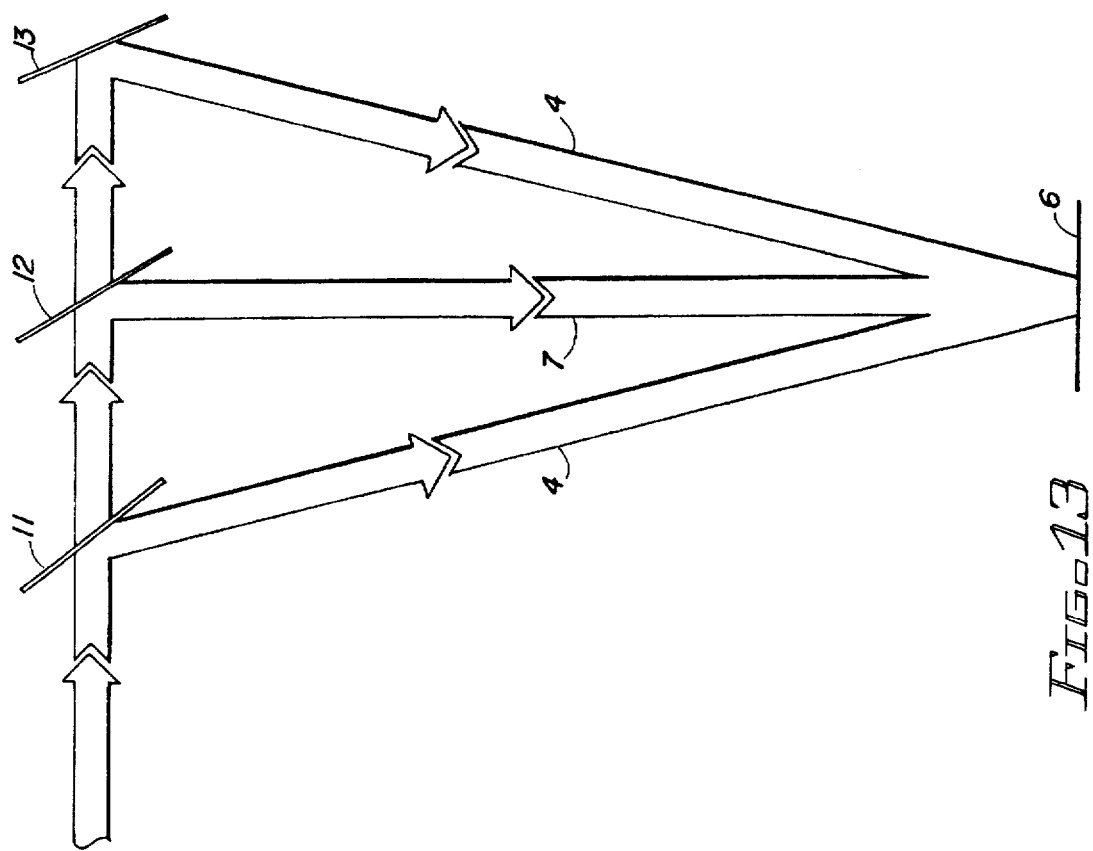
FIG. 13: Alternate optical system for the production of three-beams for sparse hole array exposure.

FIG. 13 shows an alternate optical system composed of beamsplitters 11, and 12 and mirror 13 that may be used to generate the three optical beams. The reflection coefficients of the beamsplitters need to be designed at the wavelength, polarization and angle of incidence of the laser beam to ensure equal intensity beams.

Figure 14:
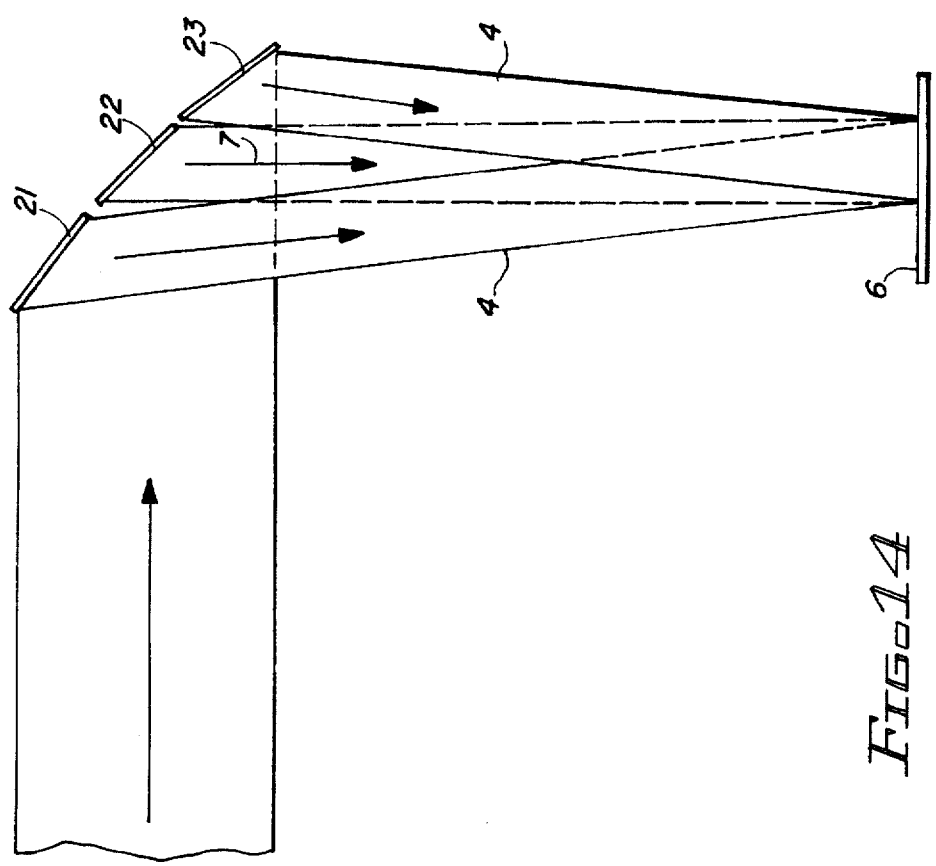
FIG. 14: Second alternate optical system for the production of three beams for sparse hole array exposure.

FIG. 14 shows a second alternate optical system composed of mirrors 21, 22, and 23 that intercept portions of the expanded optical beam and direct these portions onto the photosensitive surface.

Figure 15:
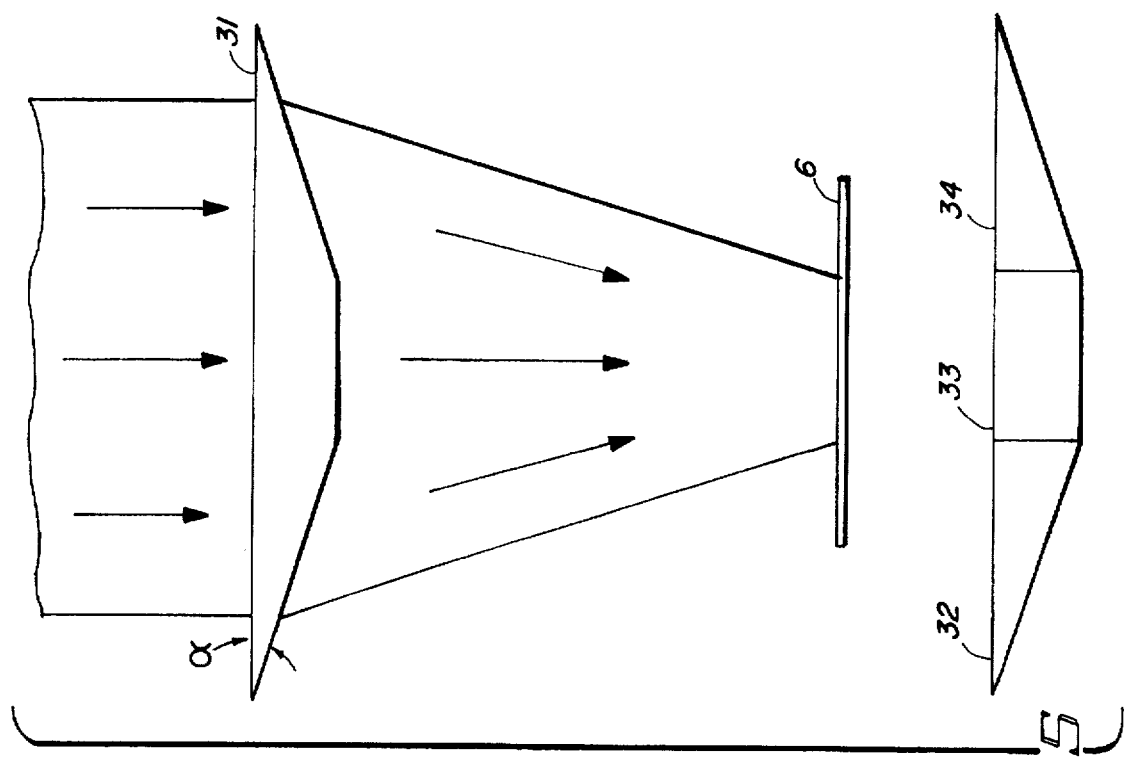
FIG. 15: Third alternate optical system for the production of three-beams for sparse hole array exposure.

FIG. 15 shows a third alternate optical system composed of a single wedged plate 31 or of a combination of three wedged plates 32, 33, and 34 to provide the three optical beams. The wedge angle, α, is determined by θ, the desired angle of incidence on the plate 6, by the equation $$\theta = \sin^{-1}(n \sin \alpha) - \alpha \quad (6)$$

where n is the refractive index of the glass wedge material.

Figure 16:
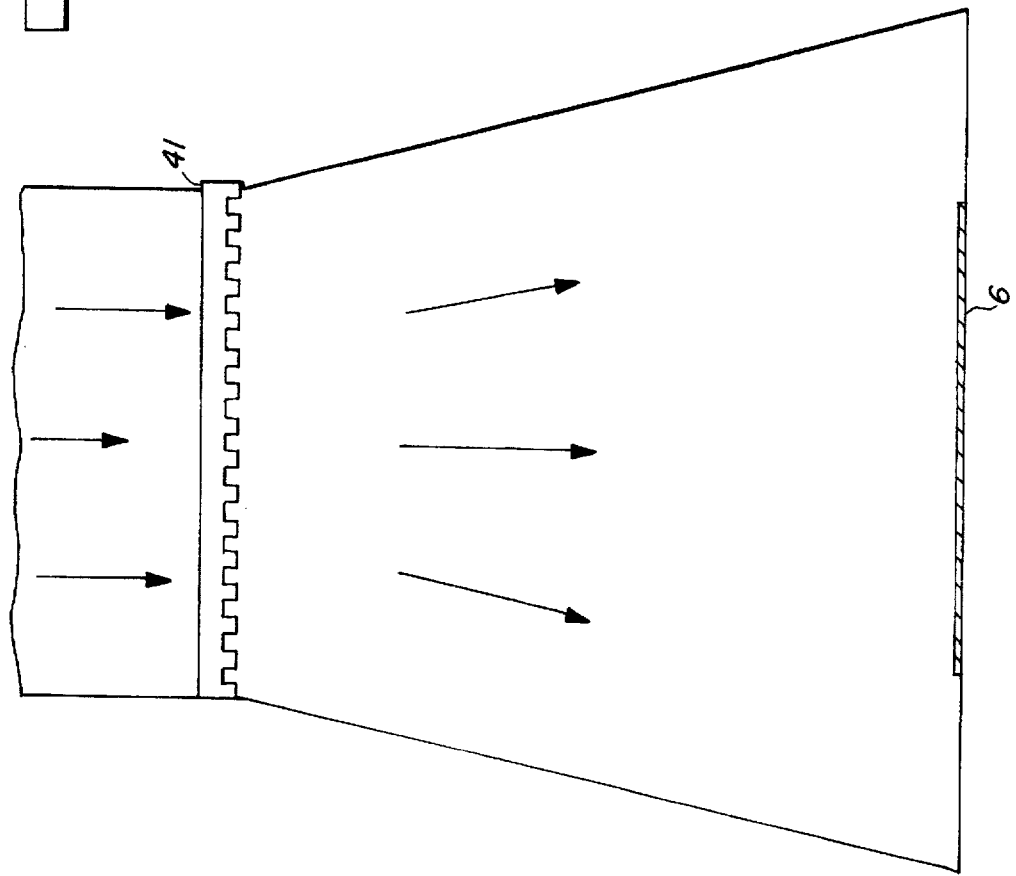
FIG. 16: Fourth alternate optical system for the production of three beams for sparse hole array exposure.

FIG. 16 shows a fourth alternate optical system composed of a diffractive grating element 41 to provide the three optical beams. The beams are shown diverging from each other in FIG. 16; in the region of overlap of all of the beams this results in an equivalent intensity pattern to that of the beams shown converging in FIGS. 12–15. The intensity of the diffracted beams is set by the depth of the grating, the angles are set by the period of the grating. In principle there will be additional optical beams at higher diffraction orders from this system. Their effect on the exposed photoresist pattern must be evaluated for each specific design.

The optimal optical configuration is dependent on many factors including the relative stability of the system, the size and cost of the optical components, and other systems considerations. In general a large number of well-known, alternate optical schemes may be used to generate the three beams for this interferometric exposure.

(5) Five-Beam Configuration for Simultaneous Exposure of Complete Sparse Hole Array The three-beam configuration (4) can be further extended using a five-beam geometry with one beam incident at normal, two additional beams incident as before at angles of +θ and −θ with all three beams in a single plane of incidence (defining the x-direction), and a further two beams incident at +θ and −θ in an orthogonal plane of incidence (y-direction). As a result of the vector nature of the electromagnetic field, the equations describing the field and the intensity become slightly more complex. The combined electric field is:

$$E = E_0 \hat{e}_y e^{-ikz} + 2E_x \hat{e}_y \cos(kx \sin\theta) e^{-ikz \cos\theta} + 2E_y (\hat{e}_y \cos\theta \cos(ky \sin\theta) + \hat{e}_z \sin\theta \sin(ky \sin\theta)) e^{-ikz \cos\theta} \quad (6)$$

where $E_0$ is the electric field strength of the normally incident beam. $E_x$ and $E_y$ are the electric field strengths of the beams defining the x- and y-periodicities, respectively, and $\hat{e}_y$ and $\hat{e}_z$ are unit vectors where the input polarization is assumed to be in the y-direction. The corresponding intensity distribution is:

$$F_{5-beam}(x,y,z) = \quad (7)$$

$$\begin{cases} 4F_x\cos^2(kx\sin\theta) + 4F_y[\cos^2\theta\cos^2(ky\sin\theta) + \sin^2\theta\sin^2(ky\sin\theta)] + \\ F_0 + 4\sqrt{F_0 F_x} \cos(kx\sin\theta)\cos(kz(1-\cos\theta)) + \\ 4\sqrt{F_0 F_y} \cos\theta\cos(ky\sin\theta)\cos(kz(1-\cos\theta)) + \\ 8\sqrt{F_x F_y} \cos\theta\cos(kx\sin\theta)\cos(ky\sin\theta) \end{cases}$$

where $F_0 = E_0^2$, $F_x = E_x^2$ and $F_y = E_y^2$. The first two terms (upper line) are related to the single-period interferometric exposure (Eq. 1); the middle three terms are very similar to the additional terms arising in the three-beam exposure process (Eq. 5) and the last term (bottom line) arises because of interference between the x- and y-oriented beams in this simultaneous exposure.

Figure 17:
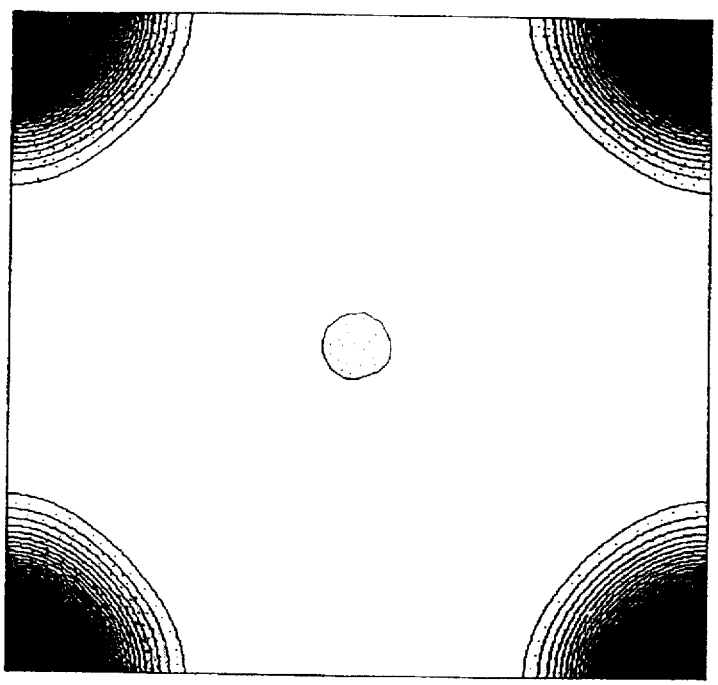
FIG. 17: Calculated photoresist profile contour plot (false shading: black is resist totally removed, white is full thickness of resist remaining) following exposure and develop steps at the plane z=0 for equal intensities in all five beams.
Figure 18:
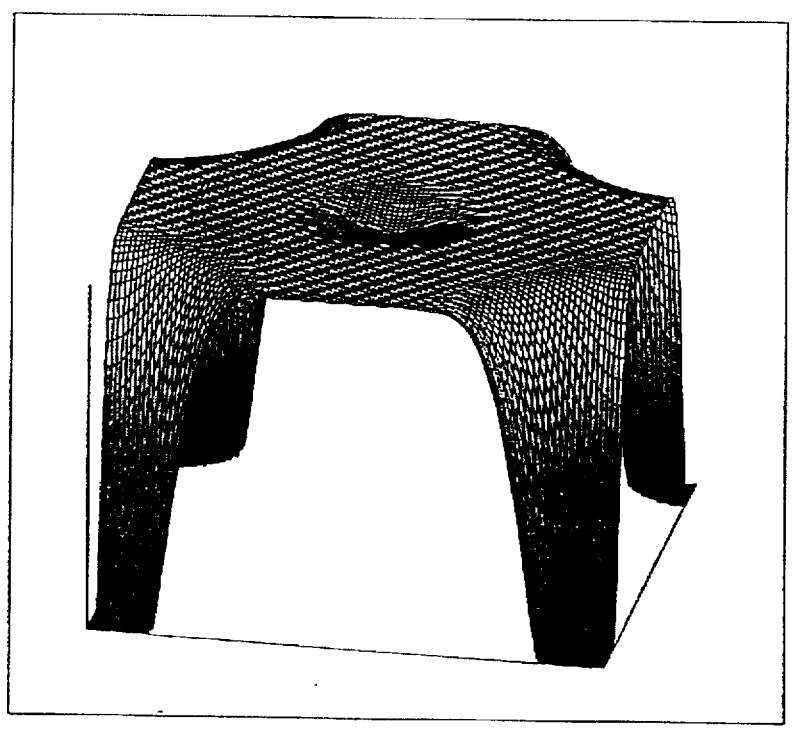
FIG. 18: Three dimensional perspective plot of the photoresist profile after development, exposed at the plane z=0 for equal intensities in the five-beam apparatus (same exposure conditions as in FIG. 16.)

FIG. 17 shows the calculated contour plot of the photoresist thickness following exposure and development at the plane z=0 for equal intensity beams ($F_0 = F_x = F_y$). The exposure intensity was adjusted to give a 1:3 line space ratio. The shading represents the thickness of the resist with black being a fully exposed and developed region with no photoresist remaining and white an unexposed, and hence undeveloped, region with the original photoresist thickness. FIG. 18 shows a perspective drawing of the same exposure.

Figure 19:
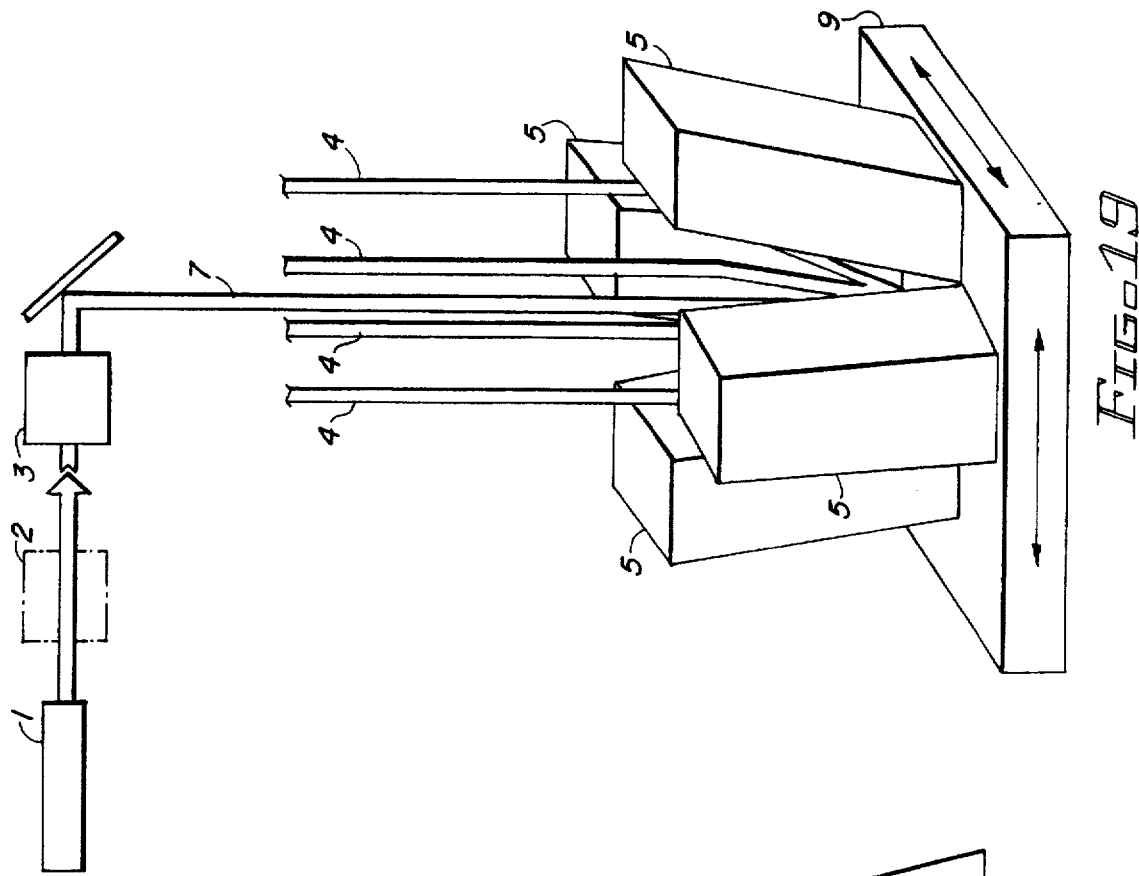
FIG. 19: Apparatus for five-beam exposure to produce sparse hole arrays.

FIG. 19 shows a experimental configuration to realize the five beams. This is identical to the configuration of FIG. 12 for the three-beam exposure with the addition of two more mirrors 5 in the orthogonal plane of incidence to the first two mirrors to form the two additional beams. All of the alternate schemes for the production of multiple beams: beamsplitters, wedged plates, and diffractive optics may be extended to this five beam geometry.

(6) Four-Beam Configuration for Simultaneous Exposure of a Sparse Hole Array

Both the three-beam and five-beam configurations have the significant trade-off that the exposure patterns are dependent on z, the distance from the optical system to the wafer or plate, and this distance must be precisely controlled to achieve the desired pattern. In each case, this results because the center beam (normal to the plate) has a different propagation constant along z than the other beams (e.g., the center beam propagates as $e^{-ikz}$, the off-axis beams propagate as $e^{-ikz \cos\theta}$). If the central beam is blocked in the five beam configuration, or if a different optical system that does not generate a normal incident beam is substituted, a four-beam configuration with the same independence on z of the two-beam exposures results. Note that the polarization of the beams allows each of the beams to interfere with the other beams. If the polarization of two of the beams were to be rotated (for an x-pair and a y-pair) a simultaneous exposure of a single exposure pair would result in a dense hole array.

The intensity distribution is readily evaluated:

$$F_{four-beam}(x,y,z) = \begin{cases} 4F_x\cos^2(kx\sin\theta) + 4F_y[\cos^2\theta\cos^2(ky\sin\theta) + \sin^2\theta\sin^2(ky\sin\theta)] + \\ 8\sqrt{F_xF_y}\cos\theta\cos(kx\sin\theta)\cos(ky\sin\theta) \end{cases} \quad (8)$$

where the notation is the same as Eq. 7. Eq. 8 is the same as the first and last lines of Eq. 7; the middle lines coming from the uniform intensity of the normally incident beam and the interference of that beam with the off-axis beams have been eliminated. The last term represents the interference of the two pairs of beams.

FIG. 20 shows the calculated countor plot of the photoresist thickness following exposure and development for equal intensity beams ($F_x=F_y$). The exposure intensity has been adjusted to give a 1:3 line:space ratio. As before, the shading represents the thickness of the remaining photoresist with black being completely removed and white full thickness. The scale has been extended to give a better idea of the overall pattern. The exposure pattern provides a different subset of the holes in the dense array than does the five-beam exposure. This is illustrated in FIG. 21 which shows points corresponding to the centers of the holes in (a) the dense array, (b) the three-beam pair and five-beam exposures, and (c) the four-beam exposure. The three-beam pair and five-beam exposures eliminate alternate rows and columns leaving a rectangular grid at a pitch of p, twice the pitch of the dense hole array. The four-beam exposure results in extra holes at the center of each square of the three-beam pair and five-beam exposures. Since all of the holes are equivalent in size, the result is a rectangular grid, at a pitch of p/√2 and rotated by 45° from the principal axes of the dense hole array. By adjusting the angle of incidence, a sparse hole array at the same period as the three-beam pair and five-beam exposures is obtained. FIG. 22 shows a perspective drawing of the four-beam exposure adjusted to provide a 1:3 line:space ratio on a 2-µm grid for direct comparison with the perspective drawing in FIG. 18 resulting from a five-beam exposure. The corresponding exposure sensitivities and photoresist profiles are given in FIG. 4 and FIG. 6, respectively. The photoresist profile is substantially improved over that of the single exposure pair for the same 1:3 line:space ratio. The sensitivity to exposure variations is also improved (i.e. the slope is lower in FIG. 4 for an intensity corresponding to a 1:3 line:space ratio).

Another significant advantage of this technique, arising from the independence on depth, is that diverging beams, for example, expanding beams from a spatial filter can be used without a requirement for collimation which is necessary for all of the other techniques that require alignment either transversely (e. g. double exposure pairs, combined optical and interferometric lithography) or longitudinally (e. g. three-beam exposure pairs and five-beam exposures). The result will be a variation in the period across the exposed area corresponding to the non-uniform angles of incidence across the wafer or plate. Depending on the requirements of the application, this may be permissible, and will result in a simpler tool with fewer optical components. In particular, for large area applications, the cost of large refractive optics or off-axis parabolic reflective optics is substantial, while large area plane mirrors are relatively inexpensive. FIG. 23 shows a experimental configuration to realize this four-beam exposure. A coherent laser source 1, e. g. an Ar-ion laser at 364 nm wavelength, provides a laser beam that passes through an isolator 2 (optional) and beam shaping optics 3, represented as a spatial filter. Following the beam shaping optics, an array of mirrors 21, 22, 23, and 24 intercepts the beam and redirects respective portions of the beam, represented by rays 4 onto plate 6 to form the interference pattern. Again, many other optical configurations including beamsplitters, wedged plates, and diffractive optics may be extended to this geometry.

It is significant to note that, since the smallest area of the photoresist film is exposed, the five-beam technique is the most efficient in the use of the available laser power, followed closely by the four-beam technique. A simple calculation based on Eqs. (1), (5) and (6) substituted into (4) gives the exposure time for a fixed laser power equally divided between all beams. The calculated values are given in the following table which also summarizes the results for the process latitude and sidewall slope of the developed photoresist profile, all normalized to the values for the single-period, 1:3 line:space ratio, interferometric lithography exposure pair.

| # | Configuraton | Exposure Time | Process Latitude | Sidewall Slope | Comments |
|---|---|---|---|---|---|
| | Single exposure pair (1:3 line:space ratio) | 1.00 (norm.) | 1.00 (norm.) | 1.00 (norm.) | reduced process latitude |
| | Single exposure pair (1:1 line:space ratio) | 1.24 | 2.95 | 3.03 | dense hole array |
| (1) | Double exposure pair, same level of resist | 0.55 × 2 = 1.10 | 1.81 | 1.93 | x-alignment required |
| (2) | Double exposure pairs, two levels of resist | 1.24 × 2 = 2.48 | 2.95 | 3.03 | x-alignment required; extra processing steps |
| (3a) | Combined single exposure pair and optical lithography on same resist level | 0.55 × 2 = 1.10 | 2.95 | 3.03 | x-alignment required; two lithography tools required |
| (3b) | Combined single exposure pair and optical lithography on two resist levels | 1.24 × 2 = 2.48 | 2.95 | 3.03 | x-alignment required; two lithography tools required; extra processing steps |

-continued

| # | Configuraton | Exposure Time | Process Latitude | Sidewall Slope | Comments |
|---|---|---|---|---|---|
| (4) | three-beam exposure pair | 0.5 × 3/2 = 0.75 | 2.10 | 2.23 | z-alignment required |
| (5) | single five-beam interferometric exposure | 0.39 × ½ × 5/2 = 0.48 | 3.02 | 3.12 | z-alignment required; single exposure for 2-D array |
| (6) | single four-beam interferometric exposure | 0.55 × ½ × 4/2 = 0.55 | 2.00 | 2.10 | no alignment required; can use diverging beams. |

The times listed for the double exposures in two levels of resist reflect the need to expose both layers. The time required for the exposure inversely impacts the throughput of a lithography tool and hence the cost per exposure. Each of the techniques disclosed herein has improved process latitude and improved photoresist sidewall angles over the prior-art technique. The optimal technique for a given situation will depend on systems issues related to the desired product and to integration with a lithography tool.

We claim:

1. In a lithographic process, a method of producing an array of sub-micrometer holes in a layer of photosensitive material deposited on a substrate, said array of sub-micrometer holes being produced substantially at a subset of a set formed by all intersections of a first array of mathematically-defined, equally-spaced parallel lines on said substrate at a first pitch, and a second array of mathematically-defined, equally-spaced parallel lines on said substrate at a second pitch, said second array rotated by an angle $\psi$ within a plane of said substrate with respect to said first array, said subset including less than said set, wherein said photosensitive material, upon exposure to light and subsequent development, affects at least one of subsequent processes in a manner different from regions of said photosensitive material that have not been exposed to said light, said light having a specific intensity within a specific range of wavelengths, a pattern and a spatial distribution, such that said development of said photosensitive material produces a mask for transferring said spatial distribution of said light from said photosensitive material to said substrate, said method comprising the steps of:

(a) exposing said photosensitive material to said pattern of said light such that only said photosensitive material that is substantially near said subset receives at least said intensity of said light within said range of wavelengths;

(b) thereafter developing said layer of said photosensitive material such that said photosensitive material substantially near said subset affects at least one of said subsequent processes in a manner different from said regions of said photosensitive material that have not been exposed to said light;

(c) transferring said pattern of said light into said substrate by using at least one of said subsequent processes; and (d) thereafter stripping said photosensitive material from said substrate.

2. A method according to claim 1 wherein said pattern of said light includes first laser interference subpatterns at said first pitch formed by the interference between two first coherent laser beams incident on said layer of photosensitive material at substantially equal azimuthal angles $+\theta_1$ and $-\theta_1$ substantially in a first plane of incidence normal to said substrate, and a second laser interference subpattern at a second pitch formed by a second interference between two second coherent laser beams incident on said layer of photosensitive material at substantially equal azimuthal angles $+\theta_2$ and $-\theta_2$ substantially in a second plane of incidence normal to said substrate and rotated by said angle $\psi$ with respect to said first plane of incidence.

3. A method according to claim 2 wherein said pattern of said light includes a first pair and a second pair of laser interference subpatterns, each of said first pair of laser subpatterns formed by two coherent laser beams incident substantially in a first plane of incidence normal to said substrate such that periods of first subpatterns are substantially an integral multiple of one another and are aligned such that a subset of maxima of said first subpatterns are substantially coincident said first subpatterns being formed in said layer of said photosensitive material by said first pair of laser subpatterns, said second pair of laser subpatterns formed by two coherent laser beams incident substantially in a second plane of incidence normal to said substrate and rotated by said angle $\psi$ with respect to said first plane of incidence such that periods of second subpatterns are substantially an integral multiple of one another and are aligned such that a subset of maxima of said second subpatterns are substantially coincident, said second subpatterns being formed in said layer of said photosensitive material by said second pair of laser subpatterns.

4. A method according to claim 3 wherein said overall pattern of said specific light includes simultaneously exposing said photoresist layer to a single interference pattern formed by five coherent laser beams with a first pair of said laser beams incident on said photoresist layer at substantially equal angles $+\theta$ and $-\theta$ to the direction perpendicular to the plane of said substrate, a second pair of said laser beams incident on said photoresist layer at substantially equal angles $+\theta$ and $-\theta$ to the direction perpendicular to the plane of said substrate with the plane defined by the two incident wavevectors of said second pair of laser beams rotated by an angle $\psi$ about the direction perpendicular to the plane of said photoresist layer from the plane defined by the two incident wavevectors of said first pair of laser beams, and said fifth laser beam incident substantially along the direction perpendicular to the plane of said substrate, and said pairs of laser interference patterns crossing each other at an angle $\psi$ in the plane of said substrate.

5. A method according to claim 3 wherein said overall pattern of said specific light includes simultaneously exposing said photoresist layer to a single interference pattern formed by four coherent laser beams with a first pair of said laser beams incident on said photoresist layer at substantially equal angles $+\theta$ and $-\theta$ to the direction perpendicular to the plane of said substrate, a second pair of said laser beams incident on said photoresist layer at substantially equal angles +θ and −θ to the direction perpendicular to the plane of said substrate with the plane defined by the two incident wavevectors of said second pair of laser beams rotated by an angle ψ about the direction perpendicular to the plane of said photoresist layer from the plane defined by the two incident wavevectors of said first pair of laser beams and said pairs of laser interference patterns crossing each other at an angle ψ in the plane of said substrate.

6. A method according to claim 2 wherein said pattern of said light is formed from at least three exposures of said photosensitive material such that said layer of photosensitive material being exposed to said light only in areas where all exposures overlap, each of said exposures having a respective intensity, wherein a sum of said intensities of said exposures in a plane of said photosensitive material comprises said pattern of said light, said exposures including, in any order:

a) a first exposure from a first pair of coherent laser beams incident on said layer of photosensitive material at said azimuthal angles +θ$_1$ and −θ$_1$ substantially in said first plane of incidence forming an intensity pattern in said layer of photosensitive material comprising a first array of equally spaced lines with a first pitch;

b) a second exposure from a second pair of coherent laser beams incident on said layer of photosensitive material at said azimuthal angles +θ$_2$ and −θ$_2$ substantially in said second plane of incidence, rotated by said angle ψ with respect to said first plane of incidence, forming an intensity pattern in said layer of photosensitive material, said layer of photosensitive material including a second array of equally spaced lines with a second pitch and rotated by said angle ψ with respect to said first array of lines; and c) a third exposure including an imaging optical lithography exposure using a mask to define said light intensity pattern, said mask including an array of apertures leading to an exposure pattern, said exposure pattern including a subset of a set of all intersections of said exposure lines.

7. A method according to claim 2 wherein said pattern of said light includes exposing said layer of photosensitive material to a pair of interference patterns, each of said interference patterns formed by three coherent laser beams with two of said laser beams incident on said layer of photosensitive material at said angles +θ and −θ substantially in said first plane of incidence and said third laser beam incident substantially along a direction perpendicular to said plane of said substrate, and said pairs of laser interference patterns crossing each other at an angle ψ in said plane of said substrate.

8. A method according to claim 1 wherein in step (a), first areas of said photosensitive material being centered about each of said intersections and overlapping with each other, receive said light, and upon said developing step, said first areas of said photosensitive material affect at least one said subsequent process differently from second areas of said photosensitive material, wherein said second areas having not received said light are substantially in regions furthermost away from said subset, such that said second areas of said photosensitive material form isolated islands.

9. A method according to claim 1 wherein at least one of said subsequent processes includes an etching step for transferring said pattern into said substrate, said substrate including first regions and second regions, said first regions including areas where said photosensitive material has been removed by said exposure step and said developing step, said second regions including areas where said photosensitive material remains after said exposure step and said developing step, said etching step includes etching said first regions of said substrate, said etching of said second regions of said substrate is substantially restricted by said photosensitive material.

10. In microelectronic processing, the method of producing sparse arrays of sub-micrometer holes in a layered material's surface using interferometric lithography, said layered material comprised of at least a bottom substrate, an intermediate mask film layer, and a top layer of photosensitive material, comprising the steps of:

(a) exposing said photosensitive layer at a first position to a first laser interference pattern at a first pitch;

(b) establishing a second position of said surface, said second position being a rotation of said layered material or of said first interference pattern about an axis perpendicular to said layered material's top surface;

(c) exposing said photosensitive material again to said first interference pattern in said second position, such that only the combined exposure dose of the two exposures near the points where the maxima of all exposures coincide add to more than a clearing dose for said layer of photoresist material, whereby said clearing dose corresponds to a dose required to develop completely through the resist, thereby defining an exposure that will produce a first array of sub-micrometer holes upon development;

(d) developing said photoresist material to produce an array of sub-micrometer holes in said layer of photoresist material;

(e) transferring said array of sub-micrometer holes through said intermediate mask film layer using said top photosensitive layer as a first mask;

(f) removing said top photosensitive layer remaining after said transfer step;

(g) recoating said layered material with a second layer of photosensitive material;

(h) repeating steps (a), (b), (c) and (d) with said layered material using a second pair of interference patterns, said second pair of interference patterns having a second pitch that is an integer multiple of said first pitch, such that a second array of holes are defined in said second layer of photosensitive material, said holes of said second array of holes being larger than said holes of said first array of sub-micrometer holes and, further, being aligned with a subset of said holes of said first array of sub-micrometer holes, said subset including less of said holes than said first array of said sub-micrometer holes;

(i) transferring said subset of said first and second arrays of holes into said layered material beneath said intermediate mask film layer using a combined mask consisting of said first array of sub-micrometer holes in said intermediate mask film layer and said second array of holes in said second layer of photoresist material, thereby producing a sparse array of sub-micrometer holes in said layered material beneath said intermediate mask film layer.

11. The method of claim 10, wherein the rotation of step (b) to establish said second position is substantially at right angles to said first position.

12. The method of claim 10, wherein the second pattern of holes of step (h) is produced by exposing said second layer of photosensitive material to a second array of holes using optical lithography, said second array of holes being larger in diameter than said first array of sub-micrometer holes, having a second pitch that is an integer multiple of said first pitch, and being aligned with a subset of said first array of sub-micrometer holes and, further, said optical lithography exposure having sufficient fluence to produce a clearing dose.

13. In microelectronic processing, the method of producing sparse arrays of sub-micrometer holes in a layer of photosensitive material atop a substrate surface using interferometric lithography comprising the steps of:

(a) exposing said photosensitive material at a first position to a first laser interference pattern formed by two coherent laser beams incident on said material at azimuthal angles $+\theta$ and $-\theta$ in a plane substantially perpendicular to said wafer surface at a first pitch determined by said angles;

(b) exposing said photosensitive material to a second laser interference pattern at a second pitch, said second pitch being an integer multiple of said first pitch and said second pattern being aligned such that a subset of maximas of said first and second patterns are substantially coincident, said subset including less than all of said maximas;

(c) establishing a second position of said photosensitive material, said second position being a rotation of said substrate or of the first and second interference patterns about an axis perpendicular to said substrate;

(d) repeating steps (a) and (b) with said substrate in said second position, such that only the combined fluence of the four exposures near the points where the maxima of all said exposures coincide add to more than the clearing dose for said layer of photoresist material, whereby, upon developing said layer of photosensitive material, sparse arrays of holes are produced.

14. The method of claim 13, wherein the combined fluence of the maxima of any three of said four exposures is below clearing dose, whereby said clearing dose is a dose required to develop completely through the resist.

15. The method of claim 13, wherein the rotation of step (c) to establish said second position is substantially at right angles to said first position.

16. In microelectronic processing, the method of producing sparse arrays of sub-micrometer holes in a layer of photosensitive material atop a substrate surface by combining interferometric lithography to define sub-micrometer holes with optical lithography to define larger holes, comprising the steps, in any order, of:

(a) exposing said layer of photosensitive material at a first position to a first laser interference pattern at a first pitch;

(b) establishing a second position of said substrate, said second position being a rotation of said substrate or of said first interference pattern about an axis perpendicular to said substrate;

(c) exposing said photosensitive material again to said first interference pattern in said second position;

(d) exposing said layer of photosensitive material to a second array of larger holes defined by optical lithography, said second array of holes having a second pitch that is substantially an integer multiple of said first pitch, such that only a combined fluence near the points where the maxima of said pair of first interference pattern exposures and said optical lithography exposure add to more than the clearing dose, thereby, upon developing said photosensitive material, a sparse array of sub-micrometer holes is produced.

17. The method of claim 16, wherein the rotation of step (b) to establish said second position is substantially at right angles to said first position.

18. In microelectronic processing, the method of producing sparse arrays of sub-micrometer holes in a layer of photosensitive material atop a substrate surface using interferometric lithography comprising the steps of:

(a) exposing said layer of photosensitive material at a first position to a first three-beam laser interference pattern, said laser interference pattern being formed by first and second coherent laser beams incident on the photosensitive material at substantially equal and opposite angles from the normal to the material surface and a third laser beam, coherent with said first and second laser beams, incident substantially along the normal to the material surface and said first, second, and third laser beams being of substantially equal intensity;

(b) establishing a second position of said substrate, said second position being a rotation of said substrate or of the three-beam laser interference pattern about an axis perpendicular to said substrate;

(c) repeating step (a) with said substrate in said second position, such that only the combined fluence of the two exposures near the points where the maxima of all said exposures coincide add to more than the clearing dose for said photoresist material, whereby said clearing dose is a dose required to develop completely through the resist, upon developing said photosensitive material, sparse arrays of sub-micrometer holes are produced.

19. The method of claim 18, wherein the rotation of step (b) to establish said second position is substantially at right angles to said first position.

20. The method of claim 18, wherein said third laser beam is of a substantially different intensity as said first and second laser beams.

21. In microelectronic processing, the method of producing sparse arrays of sub-micrometer holes in a layer of photosensitive material atop a substrate surface using interferometric lithography comprising the step of:

exposing said layer of photosensitive material at a first position to a five-beam laser interference pattern, said laser interference pattern being formed by first and second coherent laser beams incident on said layer of photosensitive material at substantially equal and opposite angles from the normal to the material surface, third and fourth laser beams coherent with said first and second laser beams, incident on the layer of photosensitive material at substantially equal and opposite angles, said equal and opposite angles substantially equal to those of said first and second laser beams in a plane of incidence rotated substantially by 90° from the plane of incidence of said first and second laser beams, and a fifth laser beam, coherent with said first through fourth laser beams, incident substantially along the normal to the substrate surface and all laser beams being of substantially equal intensity; whereby, upon developing said layer of photosensitive material a sparse array of holes is produced.

22. The method of claim 21 in which said fifth laser beam is of a substantially different intensity from said first through fourth laser beams.

* * * * *